US011532522B2

(12) United States Patent
More et al.

(10) Patent No.: US 11,532,522 B2
(45) Date of Patent: Dec. 20, 2022

(54) SOURCE/DRAIN EPI STRUCTURE FOR IMPROVING CONTACT QUALITY

(71) Applicant: Taiwan Semiconductor Manufacturing Company, Ltd., Hsinchu (TW)

(72) Inventors: Shahaji B. More, Hsinchu (TW); Cheng-Wei Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 26 days.

(21) Appl. No.: 17/221,501

(22) Filed: Apr. 2, 2021

(65) Prior Publication Data

US 2022/0230925 A1    Jul. 21, 2022

Related U.S. Application Data

(60) Provisional application No. 63/139,207, filed on Jan. 19, 2021.

(51) Int. Cl.
*H01L 21/8238* (2006.01)
*H01L 27/092* (2006.01)
*H01L 29/417* (2006.01)

(52) U.S. Cl.
CPC ............ *H01L 21/823821* (2013.01); *H01L 21/823814* (2013.01); *H01L 21/823871* (2013.01); *H01L 27/0924* (2013.01); *H01L 29/41791* (2013.01)

(58) Field of Classification Search
CPC ..... H01L 21/823821; H01L 21/823814; H01L 21/823871; H01L 27/0924; H01L 29/41791
See application file for complete search history.

(56) References Cited

U.S. PATENT DOCUMENTS

| | | | |
|---|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,287,382 B1 | 3/2016 | Lee et al. |
| 9,520,482 B1 | 12/2016 | Chang et al. |

(Continued)

OTHER PUBLICATIONS

US 9,825,038 B2, 11/2017, Lee et al. (withdrawn)
(Continued)

*Primary Examiner* — Karen Kusumakar
*Assistant Examiner* — Adam S Bowen
(74) *Attorney, Agent, or Firm* — Haynes and Boone, LLP

(57) ABSTRACT

A semiconductor structure includes an n-type epitaxial source/drain feature (NEPI) and a p-type epitaxial source/drain feature (PEPI) over a substrate, wherein a top surface of the NEPI is lower than a top surface of the PEPI. The semiconductor structure further includes a metal compound feature disposed on the top surface of the NEPI and the top surface of the PEPI; a contact feature disposed on the metal compound feature and over both the NEPI and the PEPI; and a via structure disposed over the contact feature and over the NEPI, wherein the via structure is partially in the contact feature.

20 Claims, 22 Drawing Sheets

(56) References Cited

U.S. PATENT DOCUMENTS

| | | |
|---|---|---|
| 9,576,814 B2 | 2/2017 | Wu et al. |
| 10,164,048 B1 | 12/2018 | More et al. |
| 10,396,156 B2 | 8/2019 | Tsai et al. |
| 10,468,500 B1 | 11/2019 | Tsai et al. |
| 2019/0164966 A1* | 5/2019 | Wang .............. H01L 21/823871 |
| 2020/0013871 A1* | 1/2020 | An ....................... H01L 29/785 |

OTHER PUBLICATIONS

Virginia Semiconductor, Inc., Basic Crystallographic Definitions and Properties of Si, SiGe, and Ge, Jun. 2002, 9 pages, Fredericksburg, Virginia.

Shahaji B. More et al., "Source/Drain EPI Structure for Device Boost", U.S. Appl. No. 17/106,389, filed Nov. 30, 2020, Assignee: Taiwan Semiconductor Manufacturing Co., Ltd., 32 pages specification, 18 pages drawings.

\* cited by examiner

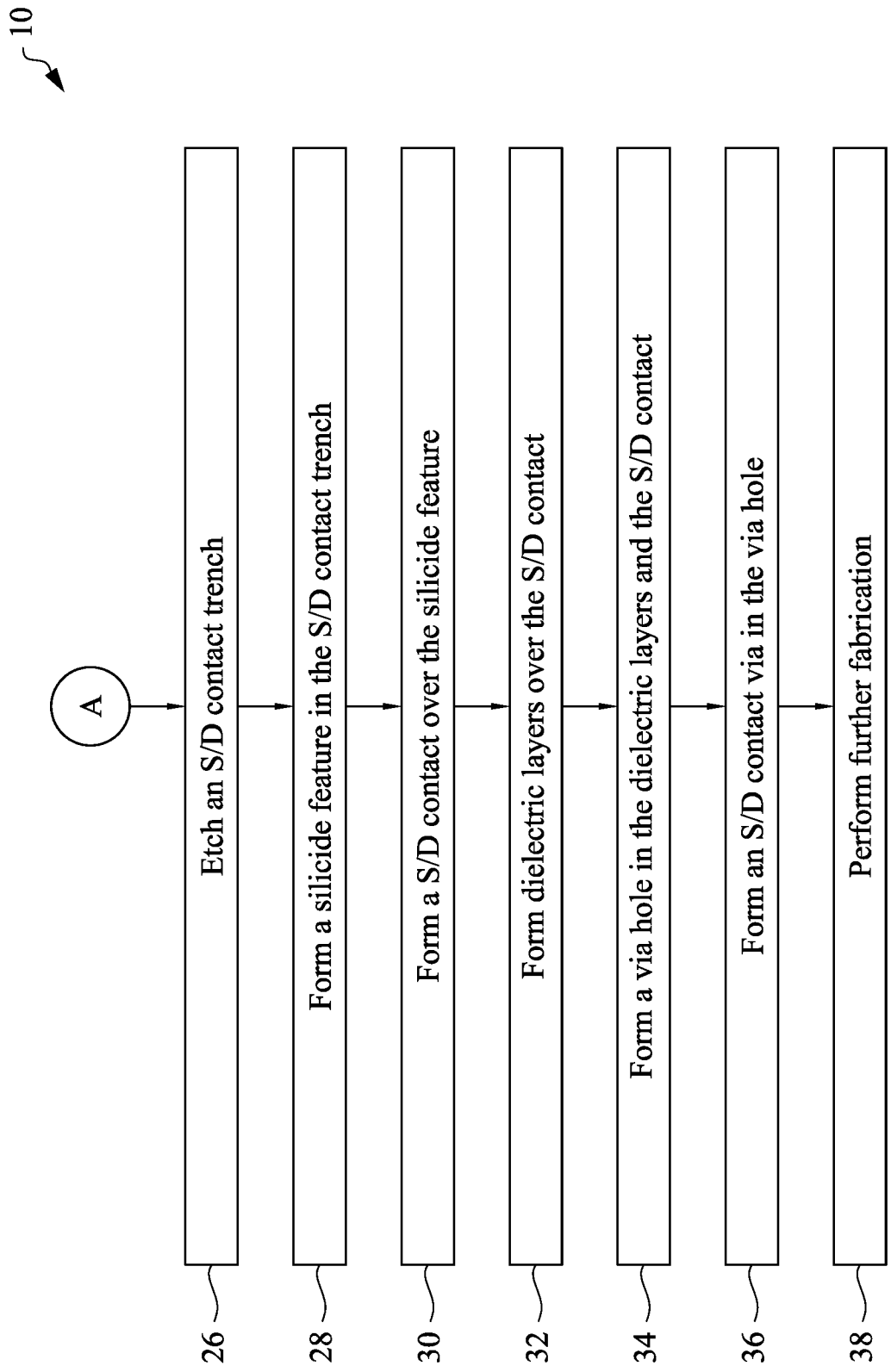

US 11,532,522 B2

SOURCE/DRAIN EPI STRUCTURE FOR IMPROVING CONTACT QUALITY

PRIORITY

The present application claims the benefits of and priority to U.S. Provisional Application No. 63/139,207, entitled "Source/Drain EPI Structures for Improving Contact Quality," filed Jan. 19, 2021, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has eased. This scaling down process generally provides benefits by increasing production efficiency and lowering associated costs. Such scaling down has also increased the complexity of processing and manufacturing ICs and, for these advancements to be realized, similar developments in IC processing and manufacturing are needed. One area of advancements is in the source/drain (S/D) features and conductive features landed on the S/D features. For example, how to form S/D features such that the series resistance between the S/D features and the conductive features can be reduced.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A and 2B show a flow chart of a method of forming a semiconductor device according to embodiments of the present disclosure.

FIGS. 3, 4, 5, 6, 7, 8, 9, 10, 11, 12, 13, 14, 15, 16, 17, 18, 19, 20, and 21 are cross-sectional views of a portion of the semiconductor device in FIG. 1A along the B-B line in FIG. 1A, during various manufacturing stages according to the method in FIGS. 2A-2B in accordance with embodiments of the present disclosure.

DETAILED DESCRIPTION

Figure 1A:
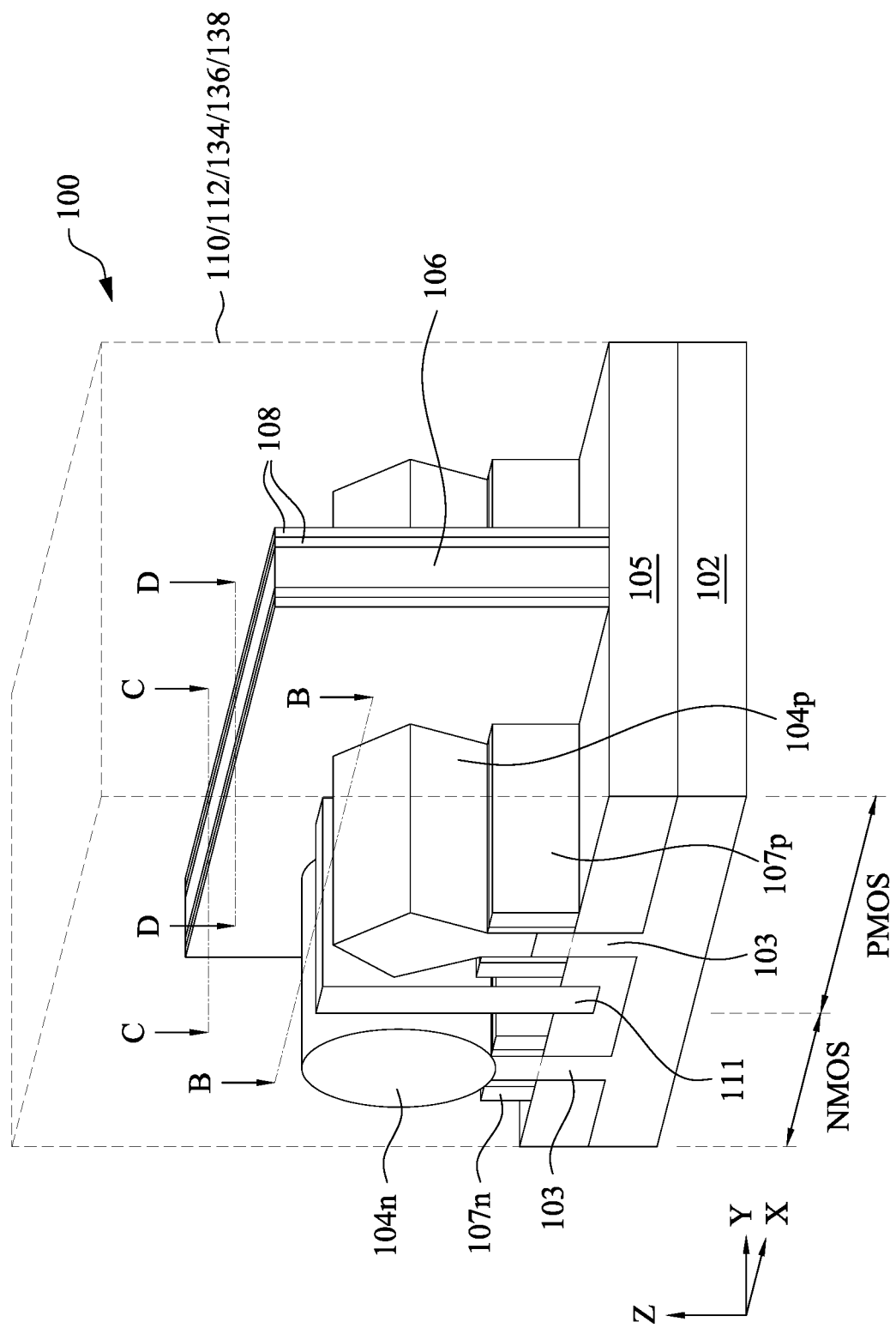
FIG. 1A shows a perspective view of a semiconductor device, in portion, in a manufacturing stage in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application relates to a semiconductor fabrication process and the structure thereof, and more particularly to providing epitaxially grown source/drain (S/D) structures that maintain the integrity of metal compound features (such as silicide) formed thereon during S/D contact and via formation processes. The epitaxially grown S/D structures are also referred to as EPI structures. In advanced technology nodes, some of the transistors are formed over single fins (i.e., having channel, source, and drain formed on a single semiconductor fin). These devices typically have n-type source/drain EPI structures (NEPI) much taller than p-type source/drain EPI structures (PEPI) and the original fin. Due to the tall NEPI structures, metal compound features (such as TiSi) formed directly above the NEPI are also higher than the corresponding metal compound features directly above the PEPI. When forming S/D contact vias (i.e., vias that land on S/D contacts), the vias can be formed very close to the metal compound features on the NEPI. This could lead to problems. For example, some chemical elements such as fluorine may be diffused into the metal compound features during the formation of S/D contact vias, adversely increasing the resistivity of the metal compound features. An object of the present disclosure is to solve the above problem and other issues that are associated with single-fin EPI structures in the advanced technology nodes. These and other aspects of the present disclosure will be further discussed with reference to FIGS. 1A-21, which depict the structures of single-fin FinFET and the processes of forming the same. Those of ordinary skill in the art should appreciate that the disclosed structures and methods can be applied to other types of devices, such as GAA (gate-all-around) devices (e.g., GAA nanowire or GAA nanosheet devices).

FIG. 1A shows a perspective view of a semiconductor device 100, in portion, in a manufacturing stage in accordance with embodiments of the present disclosure. FIGS. 1B-1, 1B-2, 1B-3, and 1B-4 show cross-sectional view of the semiconductor device 100, in portion, along the B-B line of FIG. 1A according to some embodiments. FIGS. 1C and 1D show cross-sectional view of the semiconductor device 100, in portion, along the C-C line and the D-D line of FIG. 1A, respectively, according to an embodiment. The semiconductor device 100 (or device 100) is provided for illustration purposes and does not necessarily limit the embodiments of the present disclosure to any number of devices, any number of regions, or any configuration of structures or regions. Furthermore, the device 100 may be an intermediate device or structure fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, GAA devices, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figures 1, 1B:
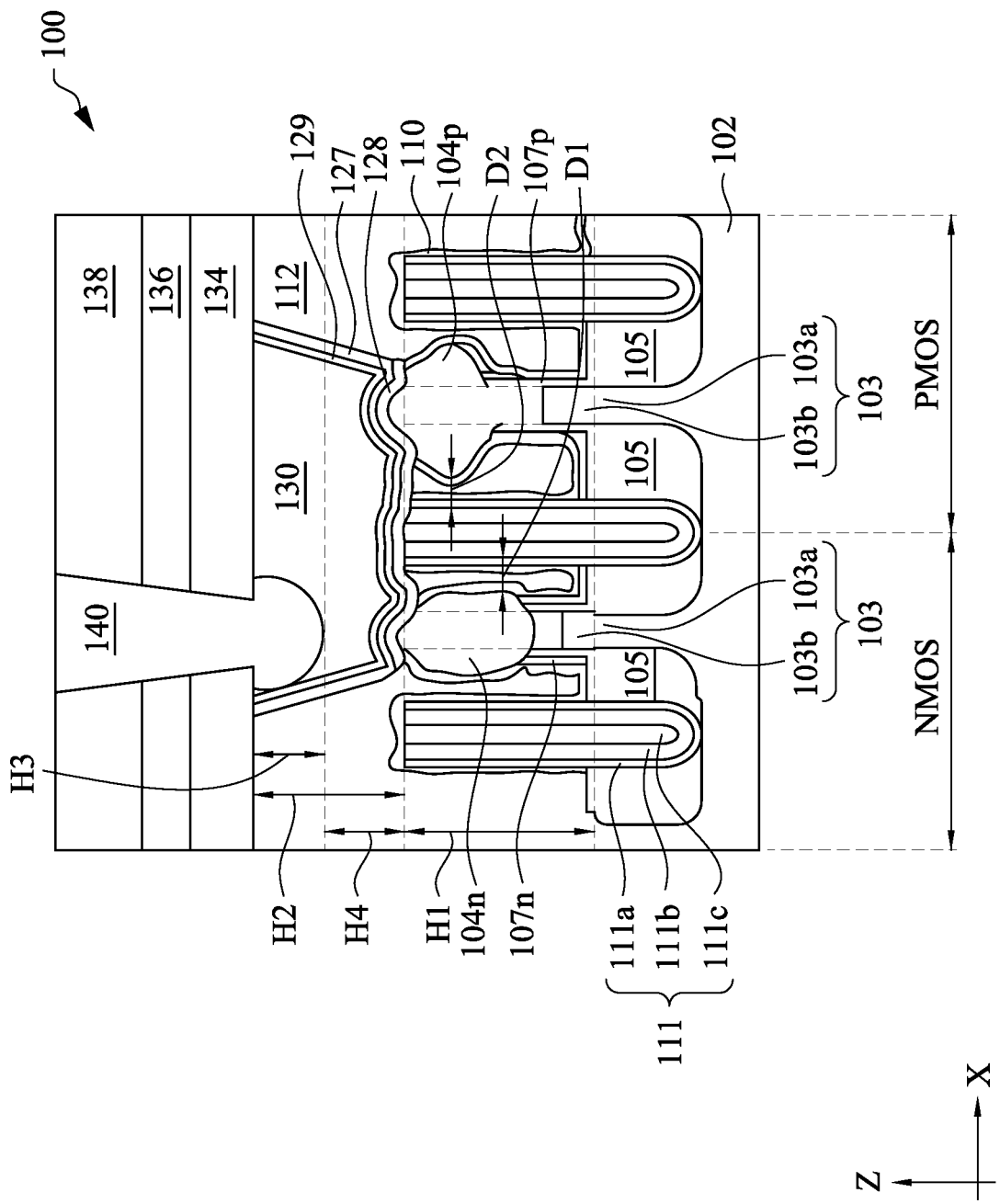
FIGS. 1B-1, 1B-2, 1B-3, and 1B-4 show cross-sectional views of the semiconductor device of FIG. 1A in S/D regions and along the B-B line of FIG. 1A, in portion, in a manufacturing stage in accordance with embodiments of the present disclosure.
Figures 1, 1B, 2:
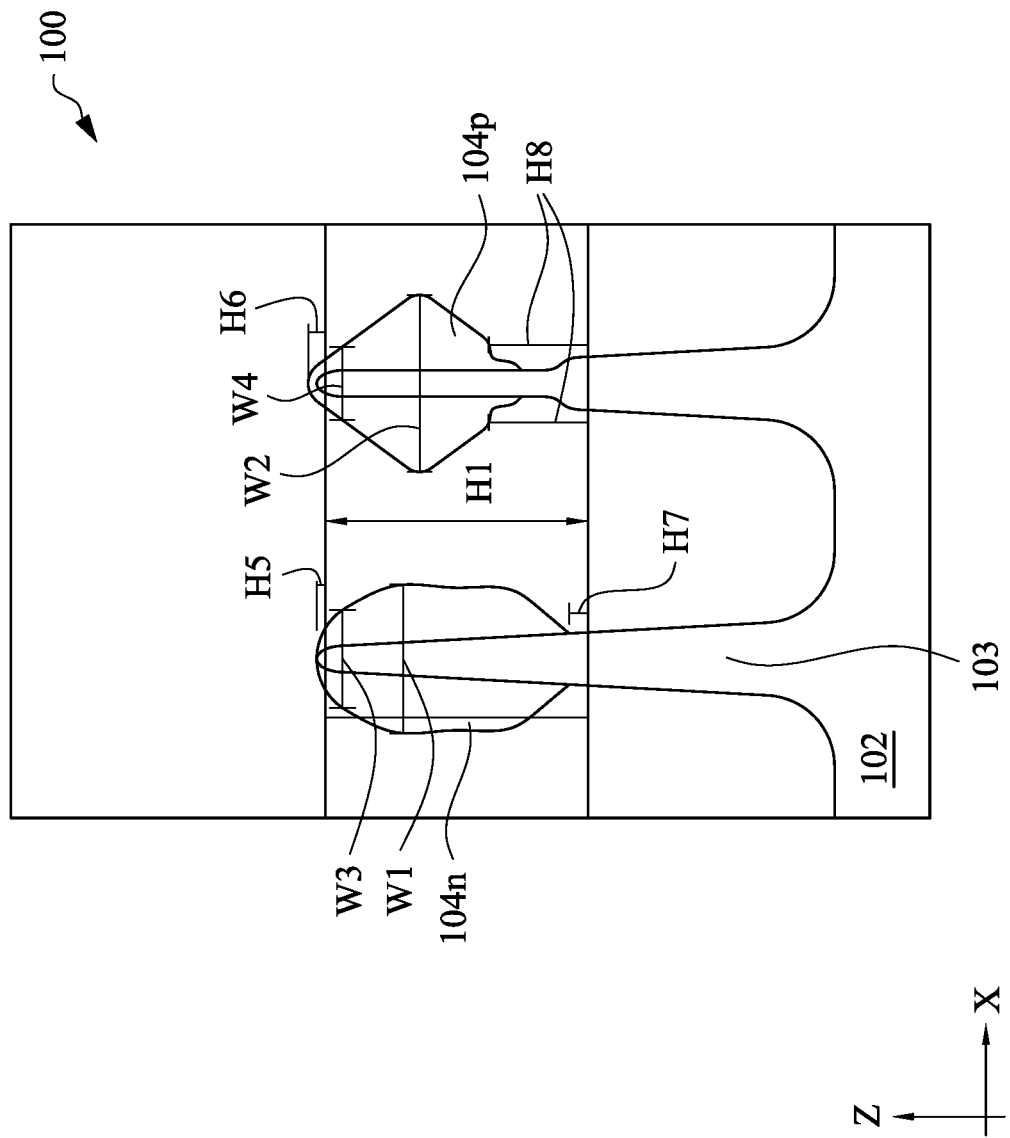
Figures 1, 1B, 2, 3:
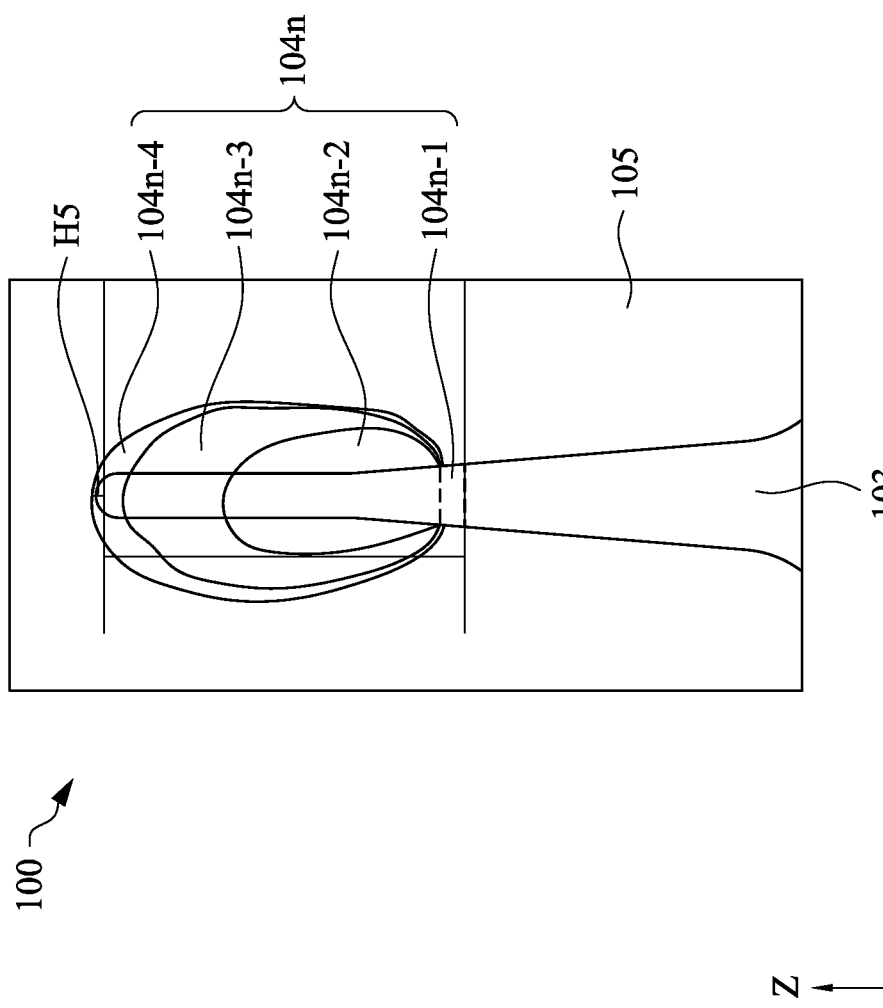
Figures 1, 1B, 2, 3, 4:
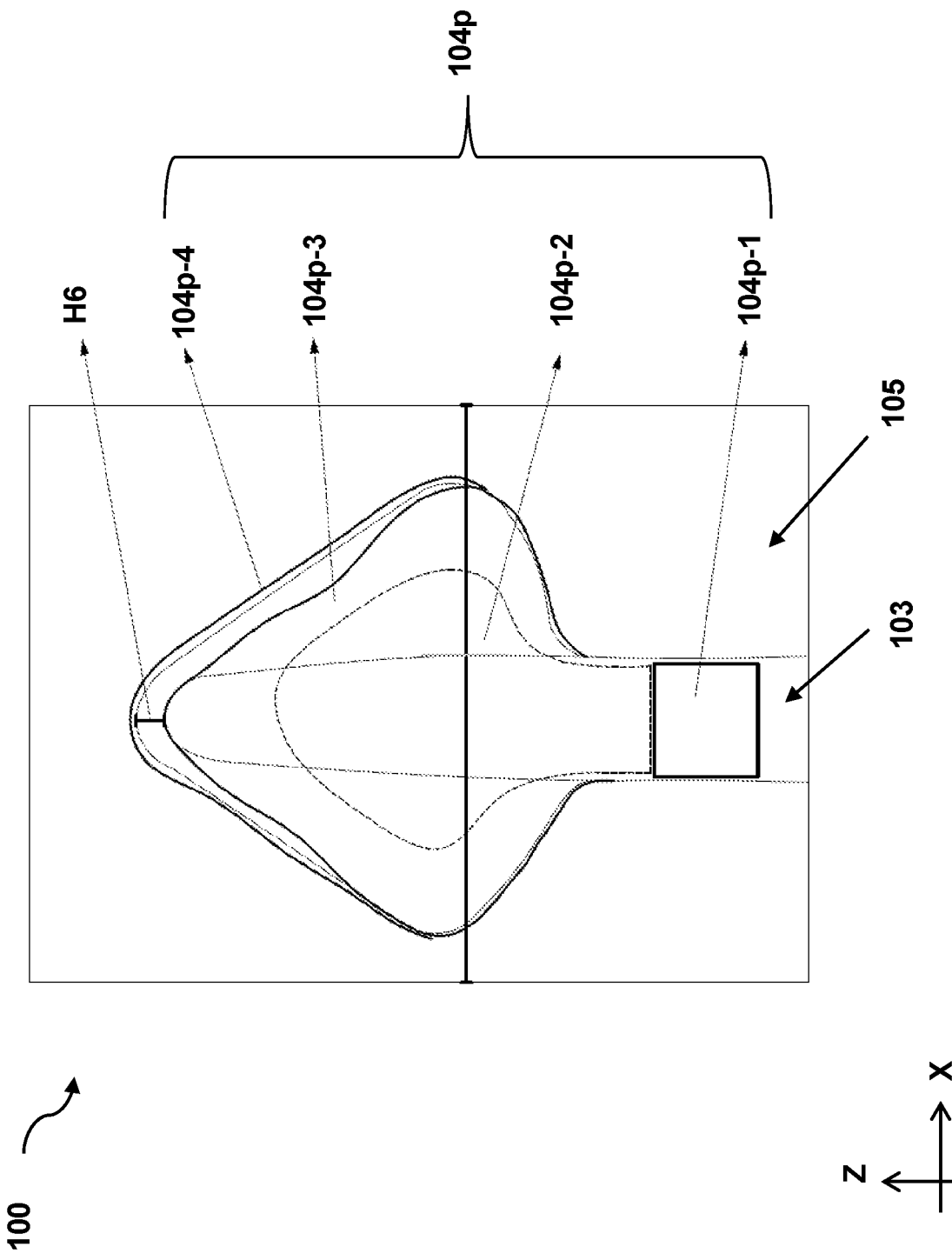
Figure 1C:
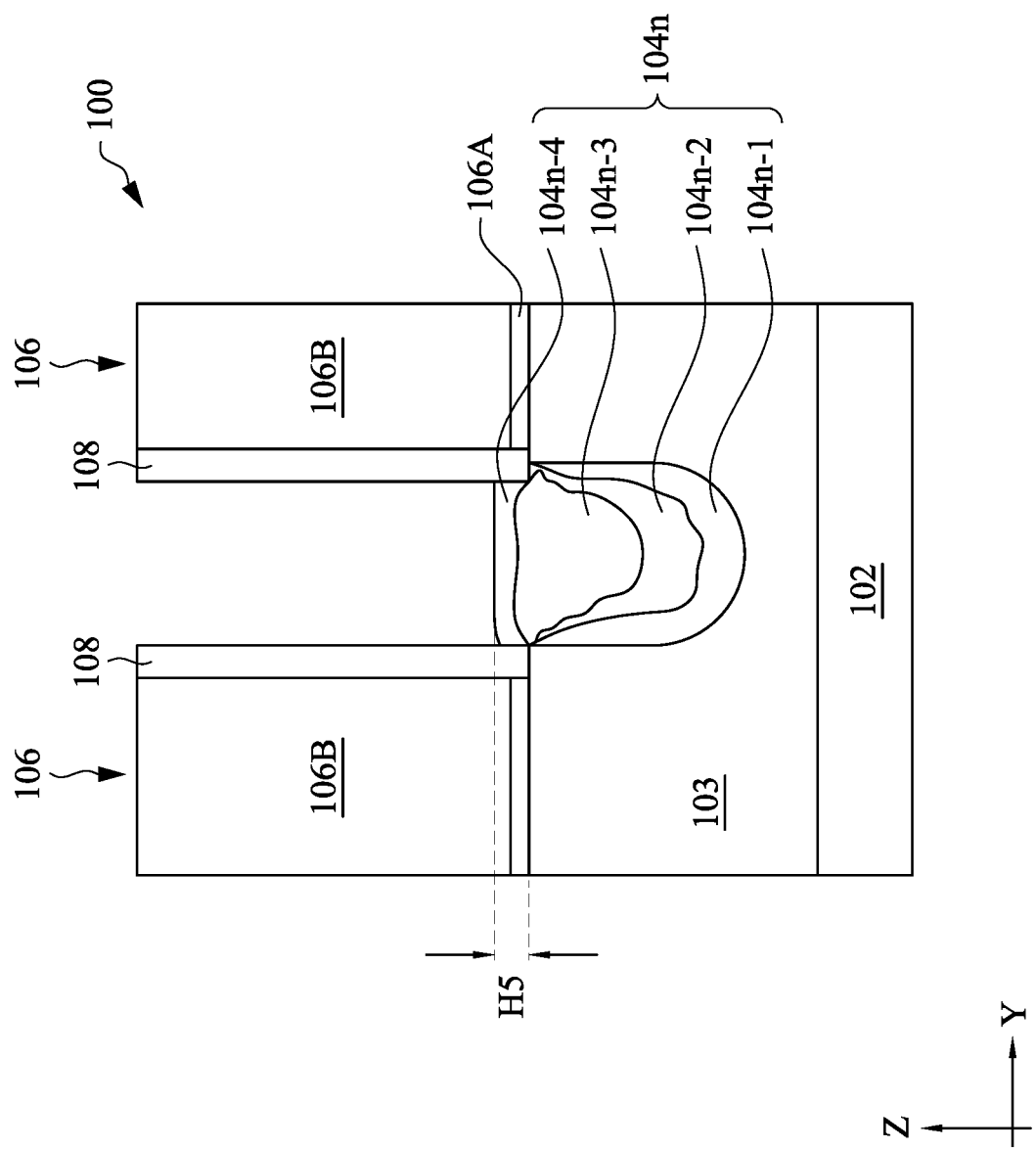
FIGS. 1C and 1D show cross-sectional views of the semiconductor device of FIG. 1A and along the C-C line and the D-D line of FIG. 1A, respectively, in portion, in a manufacturing stage in accordance with embodiments of the present disclosure.
Figure 1D:
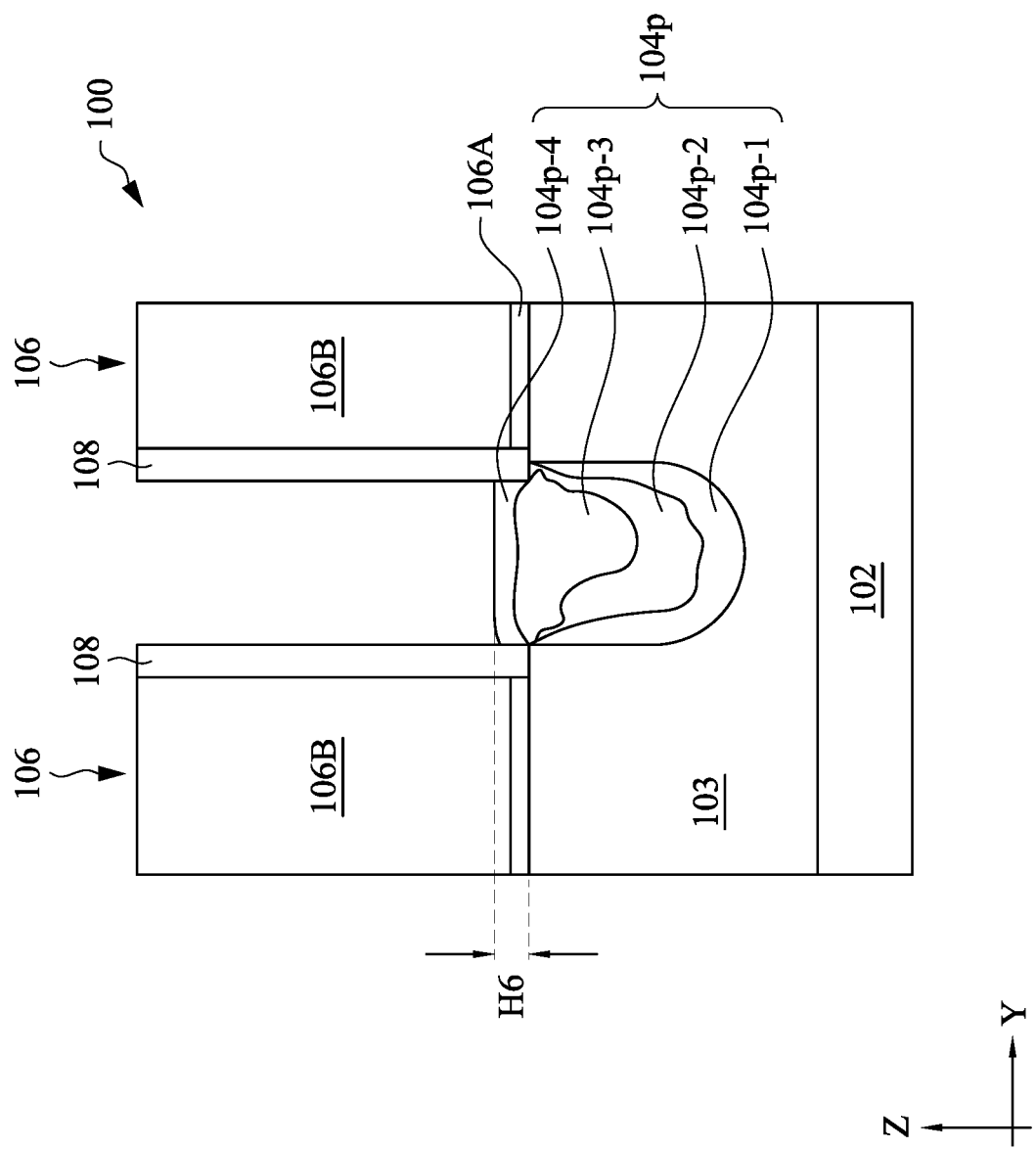

Referring to FIGS. 1A, 1B-1, 1C, and 1D collectively, in the depicted embodiment, the device 100 includes CMOS transistors, having both an NMOSFET (such as an NMOS FinFET) and a PMOSFET (such as a PMOS FinFET). The device 100 includes a substrate 102 and various features formed therein or thereon. The device 100 further includes semiconductor fins (or simply, fins) 103 extending from the substrate 102. The lower sections of the fins 103 are separated by an isolation structure 105. The device 100 further includes gate stacks (or gate structures) 106 adjacent to channel regions of the fins 103 and S/D features 104 over recessed portions of the fins 103 and on both sides of the gate stacks 106. The S/D features of the NMOSFET are denoted as 104n, and the S/D features of the PMOSFET are denoted as 104p. The device 100 further includes gate spacers 108 on sidewalls of the gate stacks 106, and fin sidewall (FSW) spacers 107 on sidewalls of the fins 103. The FSW spacers 107 on sidewalls of the fin 103 for the NMOSFET are denoted as 107n, while the FSW spacers 107 on sidewalls of the fin 103 for the PMOSFET are denoted as 107p. In the depicted embodiment, the FSW spacers 107n and 107p are disposed on the top surface of the isolation structure 105, and the FSW spacer 107n is shorter than the FSW spacer 107p. The channel regions of the NMOSFET and PMOSFET as well as the S/D features 104n and 104p are isolated by dielectric fins 111, which partially extend into the isolation structure 105. The device 100 further includes one or more dielectric layers, such as a contact etch stop layer (CESL) 110 over the gate spacers 108 and the S/D features 104, a dielectric layer (or interlayer dielectric layer or ILD) 112 over the CESL 110 and filling in the gaps between adjacent gate spacers 108, and other dielectric layers 134, 136, and 138 disposed on the ILD 112. For simplicity, the dielectric layers 110, 112, 134, 136, and 138 are collectively shown as a dashed cube in FIG. 1A. The device 100 may include other features not shown in FIG. 1A. Referring to FIG. 1B-1, the device 100 further includes a metal compound feature 128 formed over the S/D features 104n and 104p and the dielectric fin 111. In an embodiment, the metal compound feature 128 includes silicide, such as titanium silicide. Over the metal compound feature 128, the device 100 further includes barrier layers 127 and 129, an S/D contact 130, and an S/D contact via plug 140. The various features (or components) of the device 100 are further described below.

The substrate 102 is a silicon (Si) substrate in the present embodiment. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fins 103 include one or more layers of semiconductor materials such as silicon or silicon germanium. In some embodiments (for example, embodiments for GAA transistors), the fins 103 include multiple layers of semiconductor materials alternately stacked one over the other, for example, having multiple layers of silicon and multiple layers of silicon germanium alternately stacked. In the present embodiment as shown in FIGS. 1A and 1B-1, each fin 103 includes a base portion 103a over the substrate 102 and an upper portion 103b over the base portion 103a. In an embodiment, the base portion 103a is directly connected to the substrate 102 and the upper portion 103b is directly connected to the base portion 103a. In an embodiment, the base portion 103a includes the same material as the substrate 102, and the upper portion 103b includes a different material than the base portion 103a. For example, the base portion 103a includes silicon while the upper portion 103b includes silicon germanium or phosphorus-doped silicon. In an embodiment, the bottom surface of the upper portion 103b is about even with the upper surface of the isolation structure 105. Each fin 103 has a height H1 which is about 40 nm to about 80 nm, for example. The upper portion 103b in the respective source/drain regions are recessed (this part of the upper portion 103b is referred to as the recessed upper portion 103b) and are lower than the upper portion 103b in the channel region. The S/D features 104n and 104p are disposed on the recessed upper portion 103b. The recessed upper portion 103b under the S/D feature 104p is taller than the recessed upper portion 103b under the S/D feature 104n. The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102.

The S/D features 104 (104n and 104p) may include epitaxial semiconductor materials, for example, for applying proper stress and enhancing performance of the device 100. In the present embodiment, the S/D features 104n include epitaxially grown silicon, which is doped with one or more n-type dopants such as arsenic (As) or phosphorus (P); and the S/D features 104p include epitaxially grown silicon germanium (SiGe) alloy, which is doped with one or more p-type dopants such as boron (B) or indium (In). In the present embodiment, each of the S/D features 104n and 104p is grown on a single fin 103. This is advantageous for small devices, such as SRAM cells, to further increase device density. In an implementation, the S/D features 104n and 104p are formed by etching recesses into the fins 103 and epitaxially growing Si or SiGe thereon. Further, each of the S/D features 104n and 104p may include multiple layers. The S/D feature 104n has a bar shape, with its height being greater than its critical dimension (CD, which is the width of the widest part of the S/D feature). The S/D feature 104p has a diamond shape.

Referring to FIGS. 1B-2, 1B-3, and 1C (for simplicity, not all features are shown in these figures), the topmost surface of the S/D feature 104n is higher than the topmost surface of the fin 103 (the un-recessed portion of the fin 103, or the portion of the fin 103 under the gate 106) by a dimension H5. This dimension is referred to as raised height (RH). Referring to FIGS. 1B-2, 1B-4, and 1D (for simplicity, not all features are shown in these figures), the topmost surface of the S/D feature 104p is higher than the topmost surface of the fin 103 (the un-recessed portion of the fin 103, or the portion of the fin 103 under the gate 106) by a dimension H6. In other words, the S/D feature 104p has a raised height of H6. In the present embodiment, H6 is greater than H5. In an embodiment, H6 is greater than H5 by 2 nm or more. In another embodiment, H6 is about twice of H5. In an embodiment, the raised height H5 is in a range of about 0 nm to about 5 nm, such as in a range of about 0 nm to about 2 nm, and the raised height H6 is in a range of about 2 nm to about 10 nm. Having the above difference in the raised heights H5 and H6 ensures that the portion of the metal compound feature 128 directly above the S/D feature 104n is lower than the portion of the metal compound feature 128 directly above the S/D feature 104p (see FIG. 1B-1). And it further ensures enough clearance (the dimension H4 in FIG. 1B-1) between the S/D contact via plug 140 and the S/D feature 104n so that the metal compound feature 128 is not adversely impacted by the formation of the via plug 140. In an embodiment, the dimension H4 is about 5 nm to about 35 nm, which is sufficient to protect the metal compound feature 128 during the formation of the via plug 140. For example, one method of forming the via plug 140 involves chemical vapor deposition using $WF_6$ or $WCl_5$. In such case, chemical elements (such as fluorine or chlorine) released during the formation of the via plug 140 would not diffuse into the metal compound feature 128, thus maintaining the quality of the metal compound feature 128. If the dimension H4 is too small (such as less than 5 nm), then the chemical elements (such as fluorine) released during the formation of the via plug 140 might diffuse into the metal compound feature 128 and adversely increase the resistivity of the metal compound feature 128. If the dimension H4 is too large (greater than 35 nm), it would unnecessarily increase the thickness of the ILD 112 and the vertical dimension the device 100. It would also increase the thickness of the S/D contact 130, which might adversely increase the resistance thereof. Notably, the topmost surface of the fins 103 under the gate 106 for the NMOSFET and for the PMOSFET are substantially coplanar in the present embodiment. Thus, the difference in the raised heights H5 and H6 is also the difference in the top surface of the S/D features 104n and 104p. In other words, the topmost surface of the S/D feature 104p is higher than the topmost surface of the S/D feature 104n by amount of (H6-H5). Also, in the case that the NMOSFET and the PMOSFET are GAA transistors, the topmost surface of the fins 103 are the topmost surface of the channel layers in the respective GAA transistors. Thus, the above discussion of the difference in the raised heights H5 and H6 apply equally to embodiments with GAA transistors.

Referring to FIGS. 1B-2, the S/D feature 104n has a larger EPI volume than the S/D feature 104p in the present embodiment. The S/D feature 104n has a bar shape with its height H1 being about 1.5 to 2 times greater than its critical dimension (CD) W1 in an embodiment. The (110) Si facet is maintained along the "x" direction. The S/D feature 104p has a diamond shape with a CD of W2. In the present embodiment, W2 is greater than W1. Thus, the shortest horizontal distance D1 between the S/D feature 104n and the nearest dielectric fin 111 is greater than the shortest horizontal distance D2 between the S/D feature 104p and the same dielectric fin 111 or another nearest dielectric fin 111 (see FIG. 1B-1) in the present embodiment. When measured at 1 nm below the topmost surface of the fin 103, the S/D feature 104n has a width W3 and the S/D feature 104p has a width W4. The surfaces of the S/D features 104n and 104p at this plane are also referred to as platen of the respective S/D features 104n and 104p. The width W3 is also the width of the platen of the S/D feature 104n, and the width W4 is also the width of the platen of the S/D feature 104p. The width W4 is smaller than the width W3 in an embodiment. The platens of the S/D features 104n and 104p are designed to be large so that the landing area for the S/D contact 130 can be large (for reducing series resistance of the S/D contact 130). Further, in the present embodiment, the width W4 is about 2 to 4 times smaller than the width W2 (thus, presenting a diamond shape). For example, the width W4 may be in a range of about 10 nm to about 20 nm, and the width W2 may be in a range of about 30 nm to about 60 nm. In an embodiment, the S/D features 104p maintains (111) crystalline facet at the top for increased contact landing area and reduced S/D contact resistance. The FSW spacer 107n (see FIG. 1B-1) has a height of H7. The FSW spacer 107p (see FIG. 1B-1) has a height of H8. In an embodiment, H8 is 4 to 8 times greater than H7. For example, H8 may be about 10 nm to about 30 nm, and H7 may be about 2 nm to about 5 nm. The heights H7 and H8 are part of the factors that determine the profile of the S/D features 104n and 104p, such as their volumes and heights.

Referring to FIG. 1B-3, the S/D feature 104n includes multiple layers. In the depicted embodiment, the S/D feature 104n includes layers 104n-1, 104n-2, 104n-3, and 104n-4. The layer 104n-1 is a seed layer for the subsequent layer 104n-2. The layer 104n-1 may include a single layer or multiple layers and may include Si, Si:As, Si:P, or other suitable material. For example, the layer 104n-1 may include Si:As where the As dopant concentration in Si may range from about $5E10^{20}$ to about $2E10^{21}$ atom/cm$^3$. For another example, the layer 104n-1 may include Si:P where the P dopant concentration in Si may range from about $1E10^{20}$ to about $8E10^{20}$ atom/cm$^3$. In the present embodiment, the layer 104n-2 includes Si:P where the P dopant concentration in Si may range from about $1E10^{21}$ to about $2E10^{21}$ atom/cm$^3$, and the layer 104n-3 includes Si:P where the P dopant concentration in Si may range from about $1E10^{21}$ to about $5E10^{21}$ atom/cm$^3$. In the present embodiment, the layer 104n-4 includes SiGe doped with P to protect the S/D feature 104n, for example, from Ge out diffusion. In an embodiment, the layer 104n-4 includes SiGe doped with P where the Ge atom % in SiGe is about 1% to 5% and the P dopant concentration in SiGe may range from about $1E10^{21}$ to about $2E10^{21}$ atom/cm$^3$. In an embodiment, the layer 104n-1 has a thickness about 3 nm to about 10 nm, the layer 104n-2 has a thickness about 10 nm to about 30 nm, the layer 104n-3 has a thickness about 10 nm to about 20 nm, and the layer 104n-4 has a thickness about 3 nm to about 10 nm. The layer thickness, the material composition, and the dopant concentration discussed above are designed to promote the profile of the S/D feature 104n (such as formed into a bar shape, having a large volume, and so on) and to increase the conductivity and performance of the S/D feature 104n.

Referring to FIG. 1B-4, the S/D feature 104p includes multiple layers. In the depicted embodiment, the S/D feature 104p includes layers 104p-1, 104p-2, 104p-3, and 104p-4. The layer 104p-1 is a seed layer for the subsequent layer 104p-2. The layer 104p-1 may include a single layer or multiple layers and may include Si, SiGe, SiGe doped with boron, or other suitable material. For example, the layer 104p-1 may include SiGe:B where the Ge atom % in the SiGe may range from about 20% to about 40% and B dopant concentration in the SiGe may range from about $1E10^{20}$ to about $5E10^{20}$ atom/cm$^3$. In the present embodiment, the layer 104p-2 includes gradient SiGe doped with B where the Ge atom % in the SiGe gradually increases from about 30% to about 45% as its thickness increases and the B dopant concentration in the SiGe may range from about $1E10^{20}$ to about $1E10^{21}$ atom/cm$^3$. In the present embodiment, the layer 104p-3 includes a relatively constant SiGe doped with B where the Ge atom % in the SiGe is in a range from about 35% to about 65% and remains substantially constant as the layer's thickness increases, and where the B dopant concentration in the SiGe may range from about $1E10^{21}$ to about $3E10^{21}$ atom/cm$^3$. In the present embodiment, the layer 104p-4 includes SiGe doped with B to protect the S/D feature 104p, for example, from Ge out diffusion and from B being piled up. In an embodiment, the layer 104p-4 includes SiGe doped with B where the Ge atom % in SiGe gradually decreases from about 65% to 40% as its thickness increases and the B dopant concentration in the SiGe may range from about $1E10^{21}$ to about $2E10^{21}$ atom/cm$^3$. In an embodiment, the layer 104p-1 has a thickness about 5 nm to about 20 nm, the layer 104p-2 has a thickness about 10 nm to about 30 nm, the layer 104p-3 has a thickness about 5 nm to about 25 nm, and the layer 104p-4 has a thickness about 2 nm to about 10 nm. The layer thickness, the material composition, and the dopant concentration discussed above are designed to promote the profile of the S/D feature 104p (such as formed into a diamond shape, having a large platen, and so on) and to increase the conductivity and performance of the S/D feature 104p.

Referring to FIGS. 1A and 1B-1, the isolation structure 105 may include silicon oxide (SiO$_2$), silicon nitride (Si$_3$N$_4$), silicon oxynitride (SiON), fluoride-doped silicate glass (FSG), a low-k dielectric material, and/or other suitable insulating material. In an embodiment, the isolation structure 105 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 105. Other types of isolation structure may also be suitable, such as field oxide and LOCal Oxidation of Silicon (LOCOS). The isolation structure 105 may include a multi-layer structure, for example, having one or more liner layers on surfaces of the substrate 102 and the fins 103 and a main isolating layer over the one or more liner layers.

Referring to FIGS. 1A, 1C, and 1D, the gate stack 106 includes a multi-layer structure. For example, referring to FIG. 1C, the gate stack 106 may include a dielectric interfacial layer (not shown), a gate dielectric layer 106A (such as having SiO$_2$) over the dielectric interfacial layer, and a gate electrode layer 106B over the gate dielectric layer 106A. In an embodiment, the gate stack 106 includes a so-called "high-k metal gate" that may include a high-k gate dielectric layer 106A, a work function metal layer (a part of the gate electrode layer 106B) over the high-k gate dielectric layer, and a bulk metal layer (another part of the gate electrode layer 106B) over the work function metal layer. The gate stack 106 may include additional layers such as capping layers and barrier layers. In various embodiments, the dielectric interfacial layer may include a dielectric material such as silicon oxide (SiO$_2$) or silicon oxynitride (SiON), and may be formed by chemical oxidation, thermal oxidation, atomic layer deposition (ALD), chemical vapor deposition (CVD), and/or other suitable methods. The high-k gate dielectric layer may include hafnium oxide (HfO$_2$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), other suitable metal-oxides, or combinations thereof; and may be formed by ALD and/or other suitable methods. The work function metal layer may include an n-type or a p-type work function meta. An n-type work function metal may comprise a metal with sufficiently low effective work function such as titanium, aluminum, tantalum carbide, tantalum carbide nitride, tantalum silicon nitride, or combinations thereof. A p-type work function metal may comprise a metal with a sufficiently large effective work function, such as titanium nitride, tantalum nitride, ruthenium, molybdenum, tungsten, platinum, or combinations thereof. Work function metal may be deposited by CVD, PVD, and/or other suitable process. The gate electrode layer may include polysilicon or a metal such as aluminum (Al), tungsten (W), cobalt (Co), copper (Cu), and/or other suitable materials; and may be deposited using plating, CVD, PVD, or other suitable processes. The gate stack 106 may be formed by any suitable processes including gate-first processes and gate-last processes. In a gate-first process, various material layers are deposited and patterned to become the gate stack 106 before the S/D features 104 are formed. In a gate-last process (also termed as a gate replacement process), a sacrificial (or temporary) gate structure is formed first. Then, after the S/D features 104 are formed, the sacrificial gate structure is removed and replaced with the gate stack 106. In the embodiment depicted in FIG. 1A, the NMOSFET and the PMOSFET share a common gate stack 106. In alternative embodiments, the NMOSFET and the PMOSFET have their own gate stacks 106 and do not share a common gate stack.

Referring to FIGS. 1A and 1B-1, each of the fin sidewall spacers 107 and the gate spacers 108 may be a single layer or multi-layer structure. In some embodiments, each of the spacers 107 and 108 include a dielectric material, such as silicon oxide (SiO$_2$), silicon nitride (Si$_3$N$_4$), silicon oxynitride (SiON), other dielectric material, or a combination thereof. In an example, the spacers 107 and 108 are formed by depositing a first dielectric layer (e.g., a SiO$_2$ layer having a substantially uniform thickness) as an liner layer over the device 100 including the gate stacks 106 and the fins 103, and a second dielectric layer (e.g., a $Si_3N_4$ layer) as a main D-shaped spacer over the first dielectric layer, and then, anisotropically etching to remove portions of the dielectric layers to form the spacers 107 and 108. Additionally, the fin sidewall spacers 107 may be partially removed during the etching process that forms recesses into the fins 103 prior to growing the S/D features 104. In some embodiments, the fin sidewall spacers 107 may be completely removed by such etching process.

In the present embodiment, the dielectric fin 111 includes multiple layers of dielectric materials, such as layers 111a, 111b, and 111c. For example, the layer 111a may include silicon nitride. For example, the layer 111b may include a low-k dielectric material such as a dielectric material including Si, O, N, and C. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, lower than that of silicon oxide (k≈3.9). For example, the layer 111c may include silicon oxide, silicon nitride, silicon oxynitride, tetraethylorthosilicate (TEOS) formed oxide, PSG, BPSG, low-k dielectric material, other suitable dielectric material, or combinations thereof. The dielectric fin 111 may be deposited using CVD, PVD, ALD, HDPCVD, MOCVD, RPCVD, PECVD, LPCVD, ALCVD, APCVD, other suitable methods, or combinations thereof.

The CESL 110 may include silicon nitride ($Si_3N_4$), silicon oxynitride (SiON), silicon nitride with oxygen (O) or carbon (C) elements, and/or other materials. The CESL 110 may be formed by plasma enhanced CVD (PECVD) process and/or other suitable deposition or oxidation processes. The CESL 110 covers the outer surfaces of the S/D features 104 and the dielectric fins 111, the sidewalls of the spacers 107 and 108, and the top surface of the isolation structure 105.

The ILD 112 may include materials such as TEOS formed oxide, un-doped silicate glass, or doped silicon oxide such as borophosphosilicate glass (BPSG), fluoride-doped silicate glass (FSG), phosphosilicate glass (PSG), boron doped silicon glass (BSG), and/or other suitable dielectric materials. The dielectric layer 112 may be deposited by a PECVD process, a flowable CVD (FCVD) process, or other suitable deposition technique. In an embodiment, the CESL 110 is deposited as a conformal layer over the substrate 102 covering various structures thereon, and the dielectric layer 112 is deposited over the CESL 110 to fill trenches between the gate stacks 106. In an embodiment, the dielectric layers 134 and 138 may include the same material as the ILD 112 and the dielectric layer 136 may include a different material than those in the layers 134 and 138. For example, the layers 134 and 138 may include silicon oxide and the layer 136 may include silicon nitride.

The metal compound feature 128 may include titanium silicide (TiSi), nickel silicide (NiSi), tungsten silicide (WSi), nickel-platinum silicide (NiPtSi), nickel-platinum-germanium silicide (NiPtGeSi), ytterbium silicide (YbSi), platinum silicide (PtSi), iridium silicide (IrSi), erbium silicide (ErSi), cobalt silicide (CoSi), titanium germanosilicide (TiSiGe), nickel germanosilicide (NiSiGe), nickel-platinum germanosilicide (NiPtSiGe), ytterbium germanosilicide (YbSiGe), platinum germanosilicide (PtSiGe), iridium germanosilicide (IrSiGe), erbium germanosilicide (ErSiGe), cobalt germanosilicide (CoSiGe), or other suitable compounds. In an embodiment, the conductive barrier layer 127 includes silicon titanium nitride (TiSiN) and the conductive barrier layer 129 includes titanium nitride (TiN). Alternatively, each of the conductive barrier layers 127 and 129 may include titanium (Ti), tantalum (Ta), tungsten (W), cobalt (Co), ruthenium (Ru), or a conductive nitride such as titanium nitride (TiN), titanium silicate nitride (TiSiN), titanium aluminum nitride (TiAlN), tungsten nitride (WN), tantalum nitride (TaN), or combinations thereof. In embodiments, the S/D contact 130 may include tungsten (W), cobalt (Co), copper (Cu), other metals, metal nitrides, or combinations thereof. In embodiments, the via plug 140 may include tungsten (W), tungsten carbide (WC), cobalt (Co), other metals, metal nitrides, or combinations thereof. In an embodiment, the thickness H2 of the S/D contact 130 is about 20 nm to about 40 nm and the via plug 140 partially extends into the S/D contact 130 by a depth of H3 that is about 5 nm to about 15 nm. Further, the bottom of the via plug 140 that extends into the S/D contact 130 has a rounded shape, giving the via plug 140 an anchor-shaped overall profile. The depth H3 and the rounded bottom profile of the via plug 140 ensures that the via plug 140 has a large contact surface with the S/D contact 130 for reduced resistance.

Figure 2A:
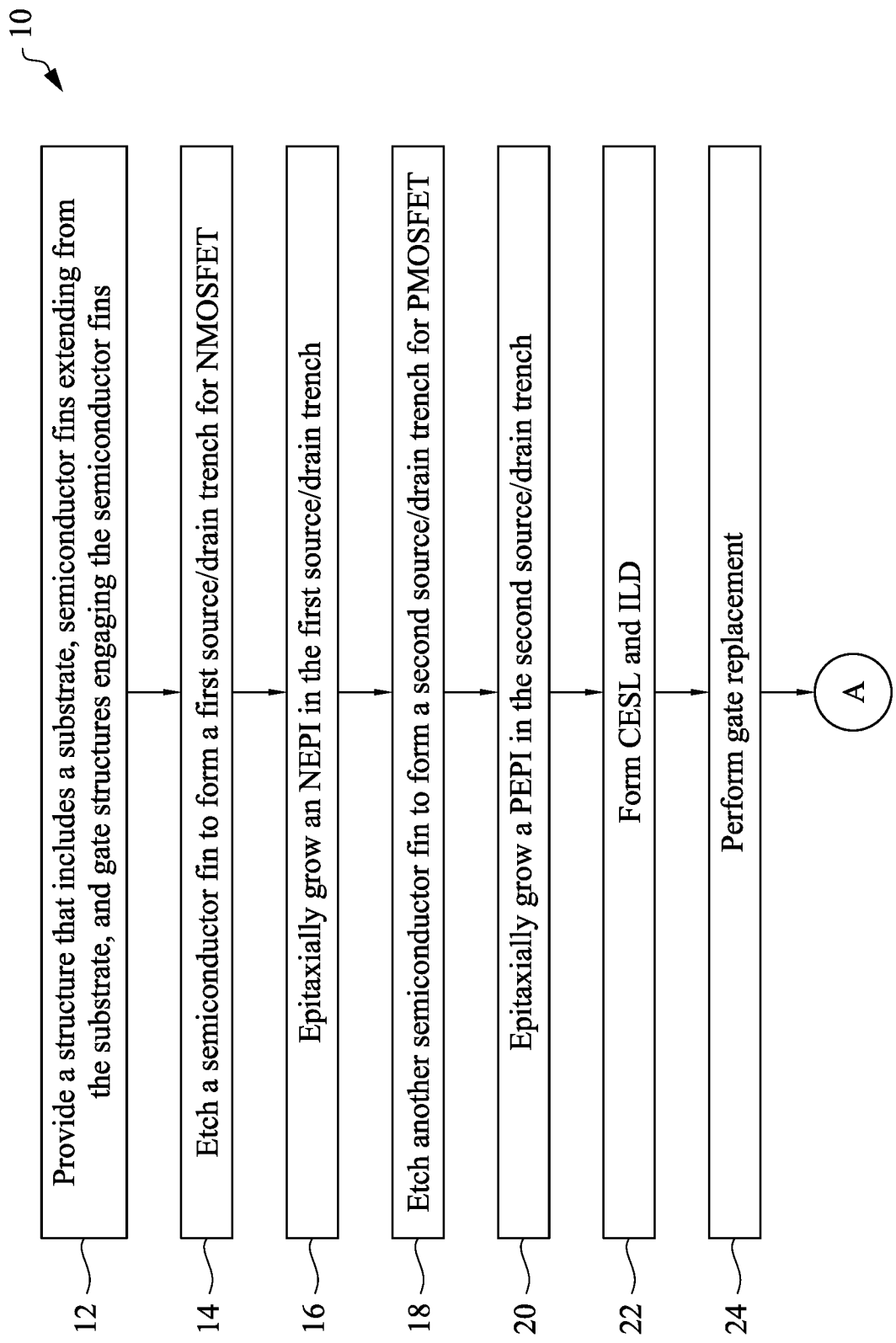
Figure 4:
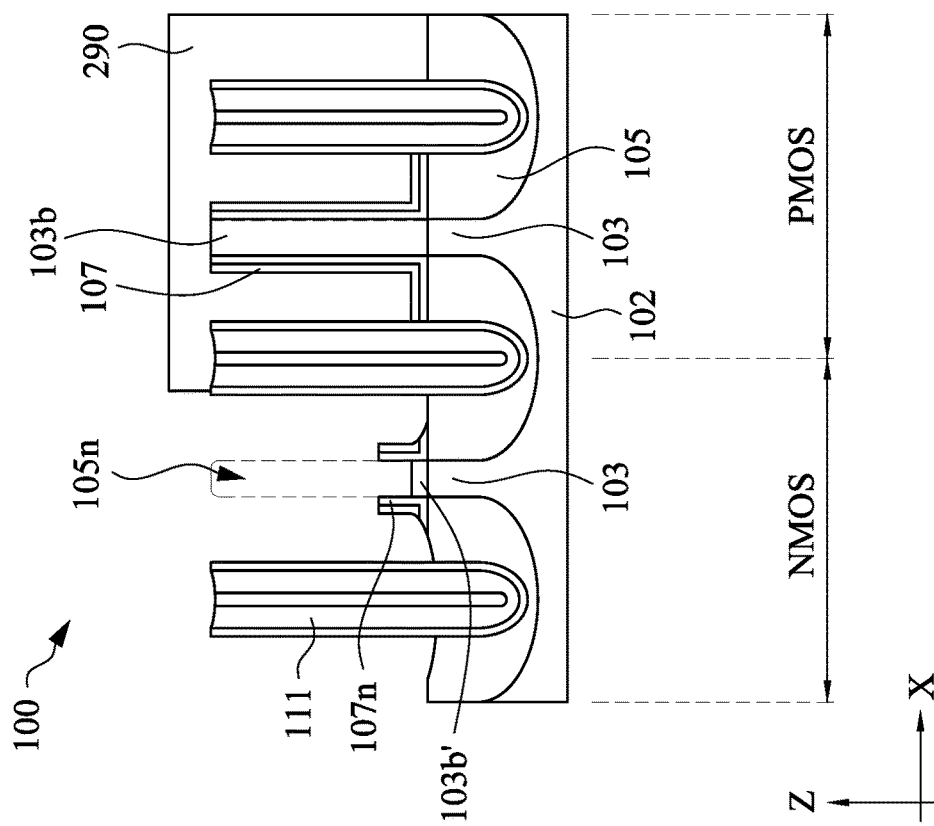
Figure 3:
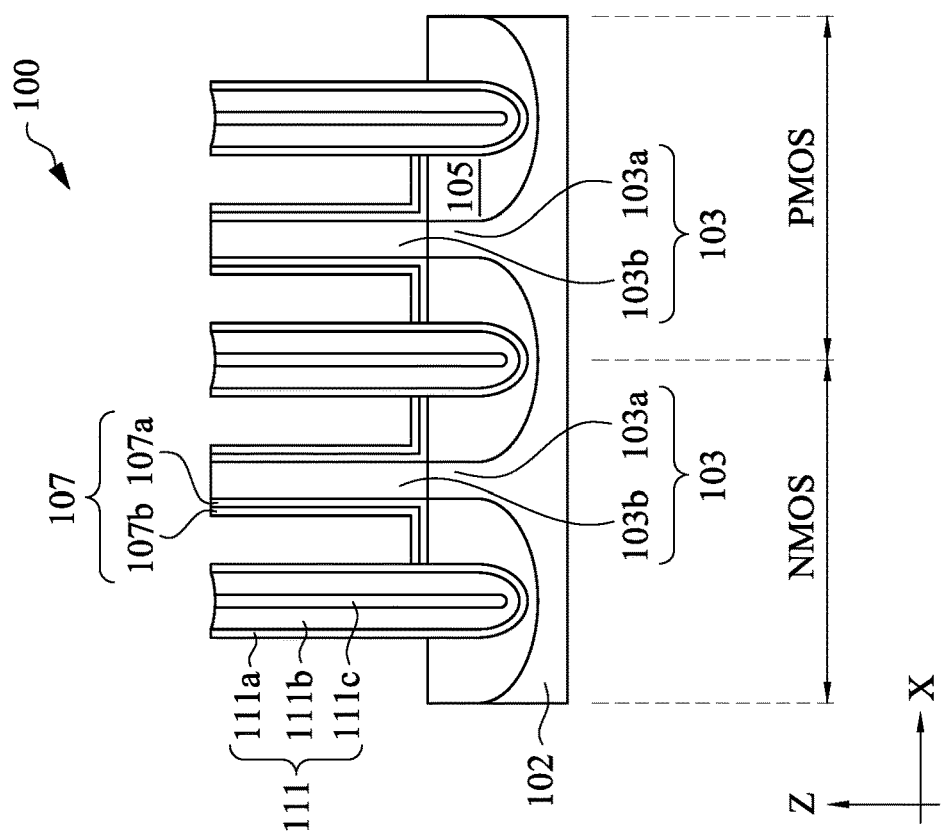

FIGS. 2A-2B show a flow chart of a method 10 of forming an embodiment of the semiconductor device 100, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or relocated for additional embodiments of the method. Method 10 is described below in conjunction with FIGS. 3-21 which are cross-sectional views of the semiconductor device 100 in various stages of a manufacturing process along the B-B line of FIG. 1A.

At operation 12, the method 10 (FIG. 2A) provides a structure of the device 100 as shown in FIG. 3. Referring to FIG. 3, the device 100 includes a substrate 102 and various features formed therein or thereon. The device 100 includes one or more semiconductor fins 103 separated by an isolation structure 105. Each fin 103 includes a base portion 103a and an upper portion 103b. In an embodiment, for NMOSFET, the base portion 103a and the upper portion 103b both include silicon, and for PMOSFET, the base portion 103a includes silicon while the upper portion 103b includes silicon germanium. The device 100 further includes fin sidewall (FSW) spacers 107 on sidewalls of the fins 103. In the embodiment depicted in FIG. 3, the FSW spacers 107 include multiple layers 107a and 107b. For example, the layer 107a may include silicon nitride and the layer 107b may include silicon oxy carbonitride, silicon carbonitride, or silicon dioxide. The device 100 further includes dielectric fins 111. Each dielectric fin 111 includes multiple dielectric layers, such as dielectric layers 111a, 111b, and 111c. The materials of the dielectric fin 111 have been discussed earlier. The dielectric fins 111 partially extend into the isolation structure 105 and are disposed between two adjacent fins 103. In an embodiment, the dielectric fins 111 are formed by a method that includes forming a sacrificial layer covering the top surface and the sidewalls of the fins 103, partially etching the isolation structure 105 between portions of the sacrificial layer on adjacent fins 103, depositing the dielectric layers 111a, 111b, and 111c between the portions of the sacrificial layer on adjacent fins 103, and removing the sacrificial layer. The dielectric layers 111a, 111b, and 111c may be deposited using ALD, CVD, PVD, or other suitable methods. Although not shown in FIG. 3, the device 100 further includes gate stacks (or gate structures) 106 adjacent to channel regions of the fin 103 and gate spacers 108 on sidewalls of the gate stacks 106 (see FIG. 1A). In an embodiment, the gate stacks 106 are sacrificial structures that will be replaced with high-k metal gate stacks in subsequent processes in the present embodiment. The sacrificial gate stacks 106 may include a sacrificial gate dielectric layer 106A (such as silicon oxide) and a sacrificial gate electrode layer 106b (such as polysilicon). The various components 102, 103, 105, 106, 107, 108, and 111 have been discussed with reference to FIG. 1A.

At operation 14, the method 10 (FIG. 2A) etches the fin 103 (particularly the upper portion 103b) in the NMOS region, to form S/D trenches 150n, such as shown in FIG. 4. This may involve multiple processes including photolithography and etching processes. For example, the operation 14 may form an etch mask 290 that covers the area for the PMOS and exposes the area for the NMOS, such as shown in FIG. 4. The mask 290 includes a material that is different than a material of the fin 103 and the FSW spacer 107 to achieve etching selectivity during subsequent etching. For example, the mask 290 may include a resist material (and thus may be referred to as a patterned resist layer and/or a patterned photoresist layer). In some embodiments, the mask 290 has a multi-layer structure, such as a resist layer disposed over an anti-reflective coating (ARC) layer. The present disclosure contemplates other materials for the mask 290, so long as the above etching selectivity is achieved. In some embodiments, the operation 14 includes a lithography process that includes forming a resist layer over the device 100 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 290) includes a resist pattern that corresponds with the photomask. Alternatively, the exposure process can be implemented or replaced by other methods, such as maskless lithography, e-beam writing, ion-beam writing, or combinations thereof.

Figure 22:
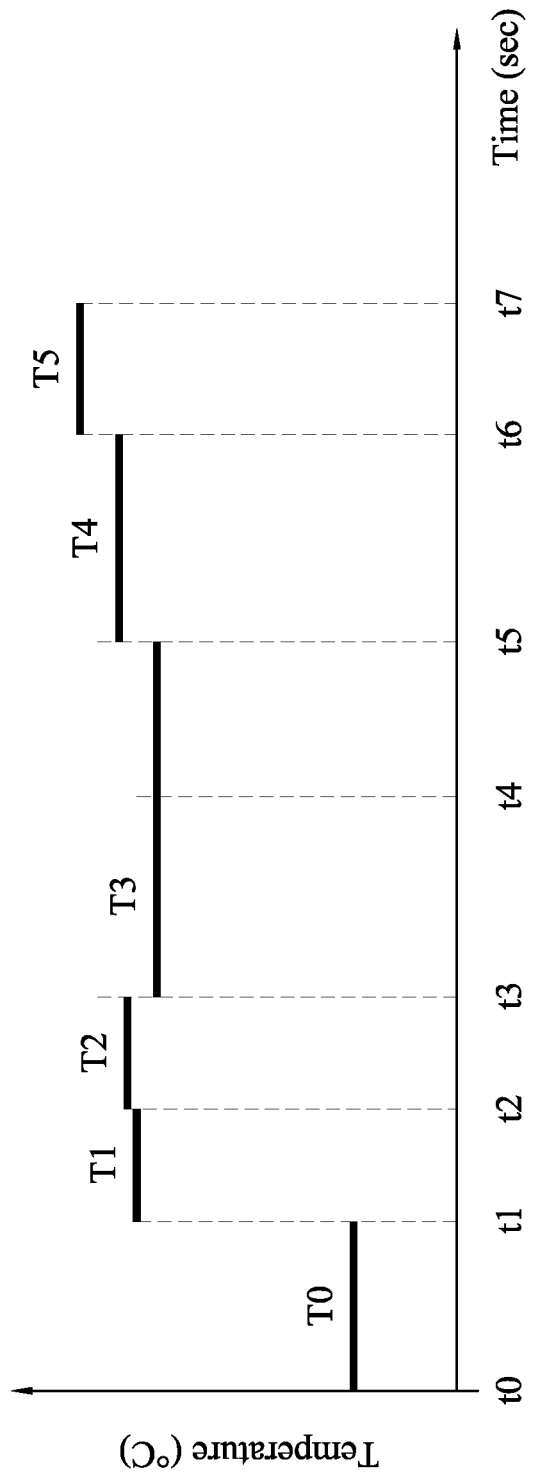
FIGS. 22 and 23 show some process conditions for forming NEPI and PEPI, respectively, according to embodiments of the present disclosure.

With the etch mask 290 in place, the operation 14 etches the fin 103 in the NMOS S/D region to recess it (the original un-recessed fin is shown in FIG. 4 with dotted line, which is also the fin under the gate stack 106). The recessed upper portion 103b of the fin 103 in the NMOS S/D region is referred to as 103b'. The etching process also partially recesses the FSW spacer 107. The recessed FSW spacer 107 in the NMOS region is referred to as 107n. The FSW spacer 107n is recessed to a height H7 (see FIG. 1B-2). The top surface of the FSW spacer 107n is higher than the bottom surface of the S/D trenches 150n. In the present embodiment, the bottom surface of the S/D trenches 150n is above the top surface of the isolation structure 105, thus the bottom and the sidewall surfaces of the S/D trench 150n are within the upper portion 103b of the semiconductor fin 103. In an alternative embodiment, the bottom surface of the S/D trenches 150n may extend below the top surface of the isolation structure 105. The operation 14 may apply dry etching, wet etching, or a combination thereof. After the etching process finishes, the operation 14 may perform a cleaning process to the S/D trenches 150n in preparation for the subsequent epitaxial growth process. For example, the cleaning process may use inductively coupled plasma with argon, $NF_3$, $NH_3$, or a combination thereof. In an embodiment, the cleaning process is performed at a temperature T0 in a range from room temperature (e.g., 25° C.) to about 250° C. and for duration from t0 to t1 that is about 80 seconds to about 400 seconds, as shown in FIG. 22.

At operation 16, the method 10 (FIG. 2A) epitaxially grows the S/D feature 104n in the trench 150n. This involves multiple steps to grow the multiple layers (104n-1, 104n-2, 104n-3, and 104n-4) of the S/D feature 104n, which are discussed below with reference to FIGS. 5-7 and FIG. 22. FIG. 22 illustrates the duration and temperature for each step of the processes in the operation 16.

Figure 5:
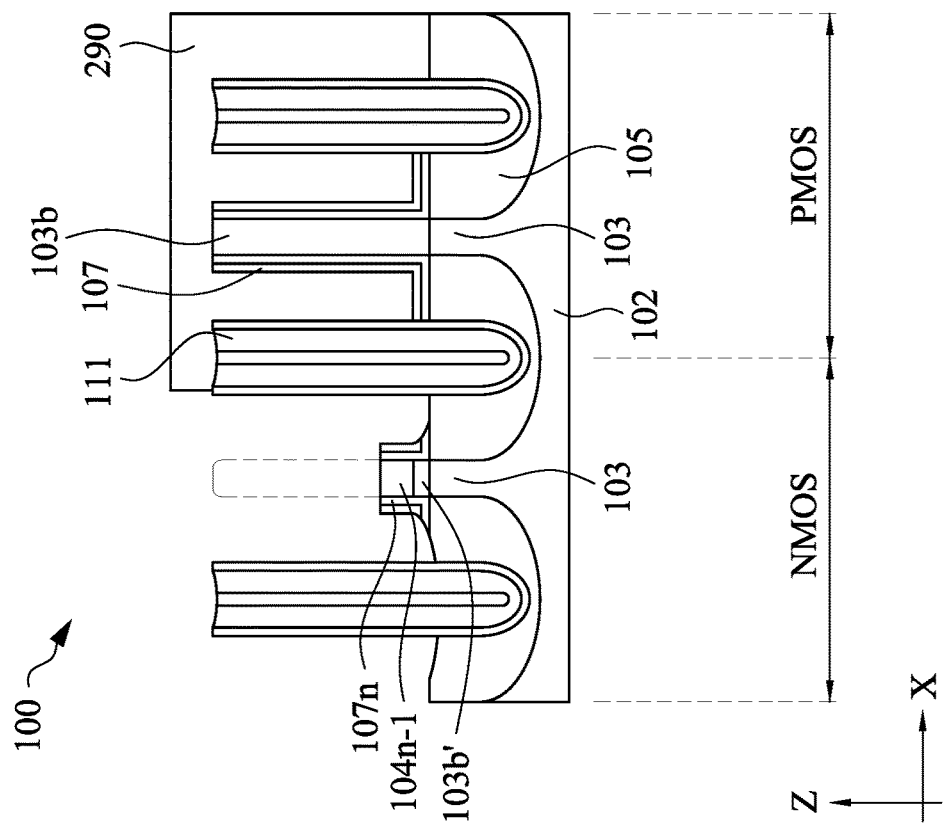

As shown in FIG. 5, the layer 104n-1 is grown on the recessed upper portion 103b' of the fin 103 in the S/D trenches 150n. In an embodiment, the operation 16 includes depositing a seed layer as the layer 104n-1 with precursors such as dichlorosilane (DCS), $AsH_3$, HCl, and/or other suitable gases and at a pressure about 100 torr to about 600 torr. Further, the deposition is performed at a temperature T1 in a range from about 600° C. to about 700° C. and for duration from t1 to t2 that is about 100 seconds to about 400 seconds, as shown in FIG. 22. Then, the operation 16 performs an etching process to the deposited seed layer, for example, using HCl and at a pressure about 100 torr to about 500 torr. Further, the etching is performed at a temperature T2 in a range from about 650° C. to about 750° C. and for duration from t2 to t3 that is about 10 seconds to about 80 seconds, as shown in FIG. 22. With the above deposition and etching, the layer 104n-1 is grown to a thickness about 3 nm to about 10 nm. In an embodiment, the layer 104n-1 includes Si:As where the As dopant concentration in Si may range from about $5E10^{20}$ to about $2E10^{21}$ atom/cm³. In another embodiment, the layer 104n-1 includes Si:P where the P dopant concentration in Si may range from about $1E10^{20}$ to about $8E10^{20}$ atom/cm³.

Figure 6:
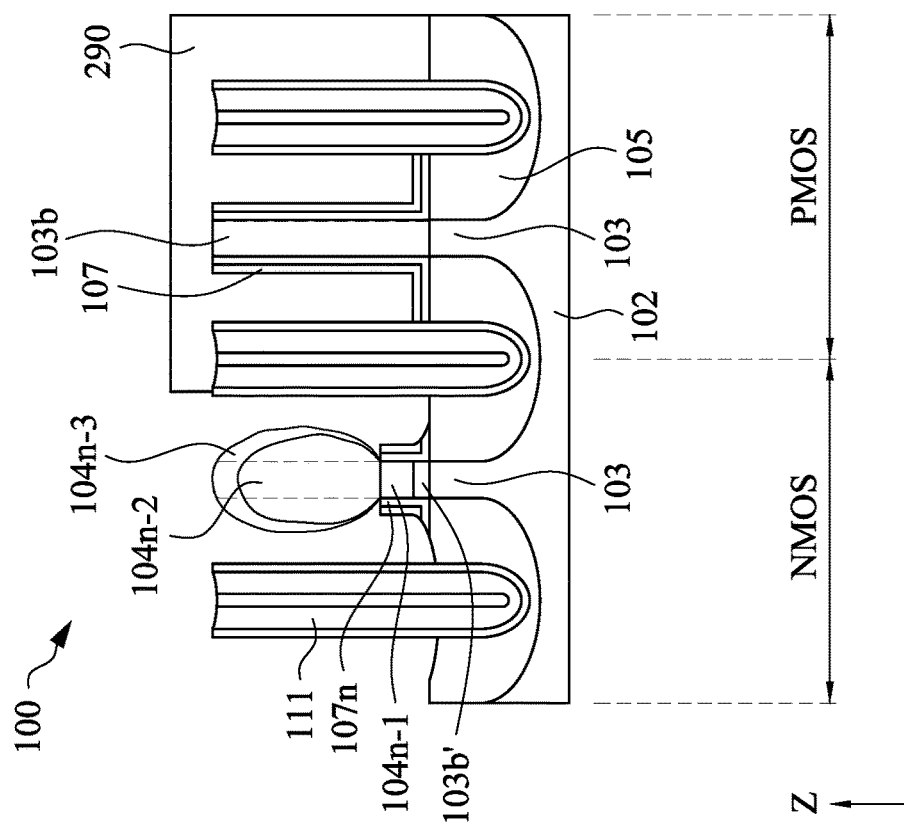

As shown in FIG. 6, the layers 104n-2 and 104n-3 are grown on the layer 104n-1. In an embodiment, the operation 16 includes depositing the layers 104n-2 and 104n-3 with precursors such as $SiH_4$, $PH_3$, HCl, and/or other suitable gases and at a pressure about 100 torr to about 600 torr. Using the combination of $PH_3$ and $SiH_4$ increases the P doping in the layers 104n-2 and 104n-3 for enhanced performance. Further, the deposition is performed at a temperature T3 in a range from about 600° C. to about 700° C. and for duration from t3 to t4 that is about 50 seconds to about 300 seconds, as shown in FIG. 22. Then, the operation 16 performs an etching process to the deposited layers, for example, using HCl, $SiH_4$, and/or other suitable etchants and at a pressure about 100 torr to about 500 torr. Further, the etching is performed at the temperature T3 in a range from about 600° C. to about 700° C. and for duration from t4 to t5 that is about 10 seconds to about 80 seconds. With the above deposition and etching, the layer 104n-2 is grown to a thickness about 10 nm to about 30 nm and the layer 104n-3 is grown to a thickness about 10 nm to about 20 nm. In an embodiment, the layer 104n-2 includes Si:P where the P dopant concentration in Si may range from about $1E10^{21}$ to about $2E10^{21}$ atom/cm³ and the layer 104n-3 includes Si:P where the P dopant concentration in Si may range from about $1E10^{21}$ to about $5E10^{21}$ atom/cm³.

Figure 7:
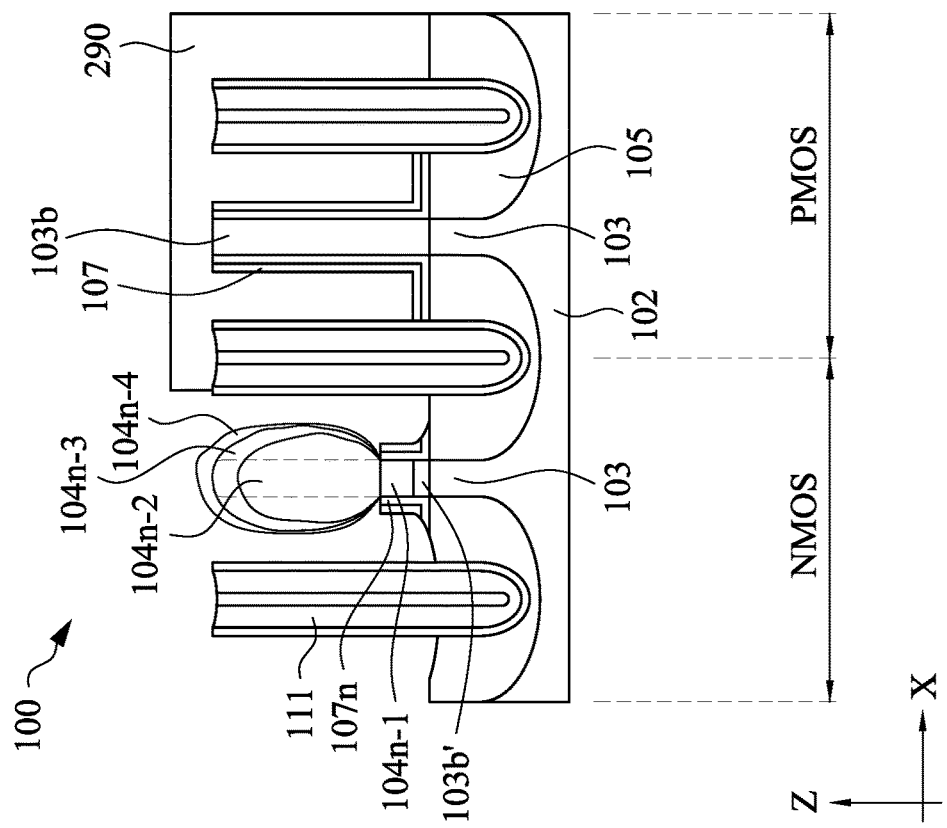

As shown in FIG. 7, the layer 104n-4 is grown on the layer 104n-3. In an embodiment, the operation 16 includes depositing the layer 104n-4 with precursors such as DCS, $PH_3$, HCl, and/or other suitable gases, and at a pressure about 100 torr to about 600 torr. Further, the deposition is performed at a temperature T4 in a range from about 650° C. to about 750° C. and for duration from t5 to t6 that is about 20 seconds to about 100 seconds, as shown in FIG. 22. Then, the operation 16 performs an etching process to the deposited layer, for example, using HCl, $GeH_4$, and/or other suitable etchants and at a pressure about 5 torr to about 50 torr. Further, the etching is performed at a temperature T5 in a range from about 700° C. to about 780° C. and for duration from t6 to t7 that is about 20 seconds to about 80 seconds, as shown in FIG. 22. With the above deposition and etching, the layer 104n-4 is grown to a thickness about 3 nm to about 10 nm. In an embodiment, the layer 104n-4 includes SiGe doped with P where the Ge atom % in SiGe is about 1% to 5% and the P dopant concentration in SiGe may range from about $1E10^{21}$ to about $2E10^{21}$ atom/cm$^3$. The operation 16 may use H$_2$ or N$_2$ gas as the carrier gas for the precursors and etchants when forming the layers 104n-1, 104n-2, 104n-3, and 104n-4 during the various deposition and etching processes discussed above. Further, in an embodiment, the various temperatures have the following relations: T5>T4>T3, T3<T1≤T2, and T3>T0.

Figure 8:
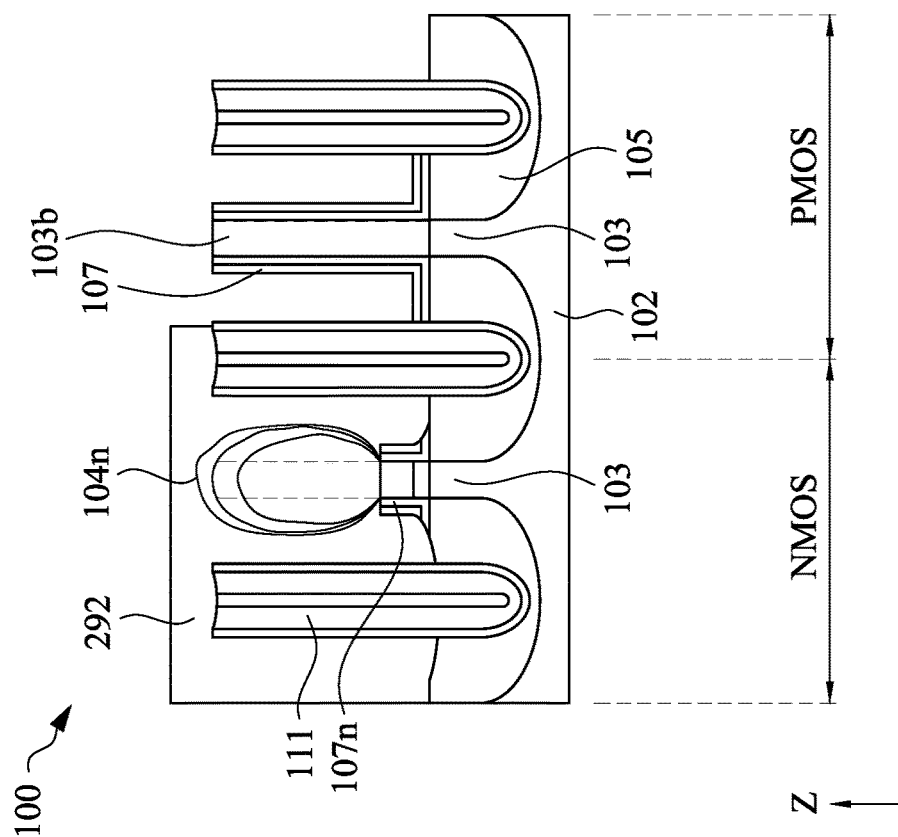
Figure 9:
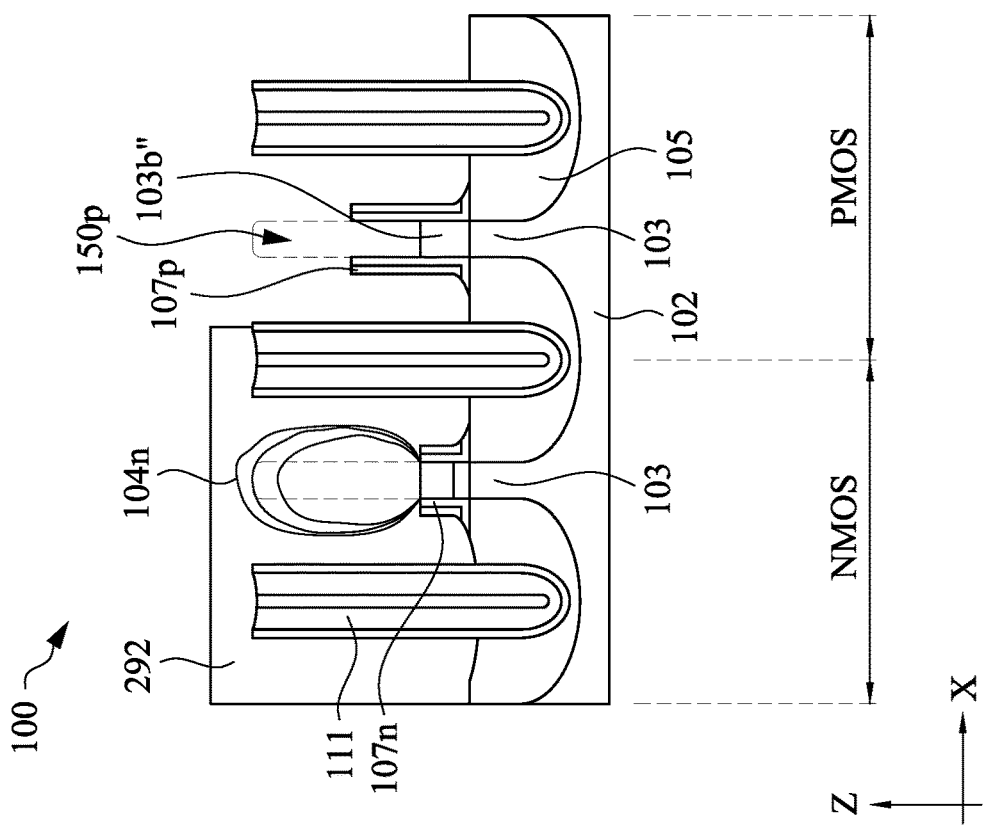
Figure 23:
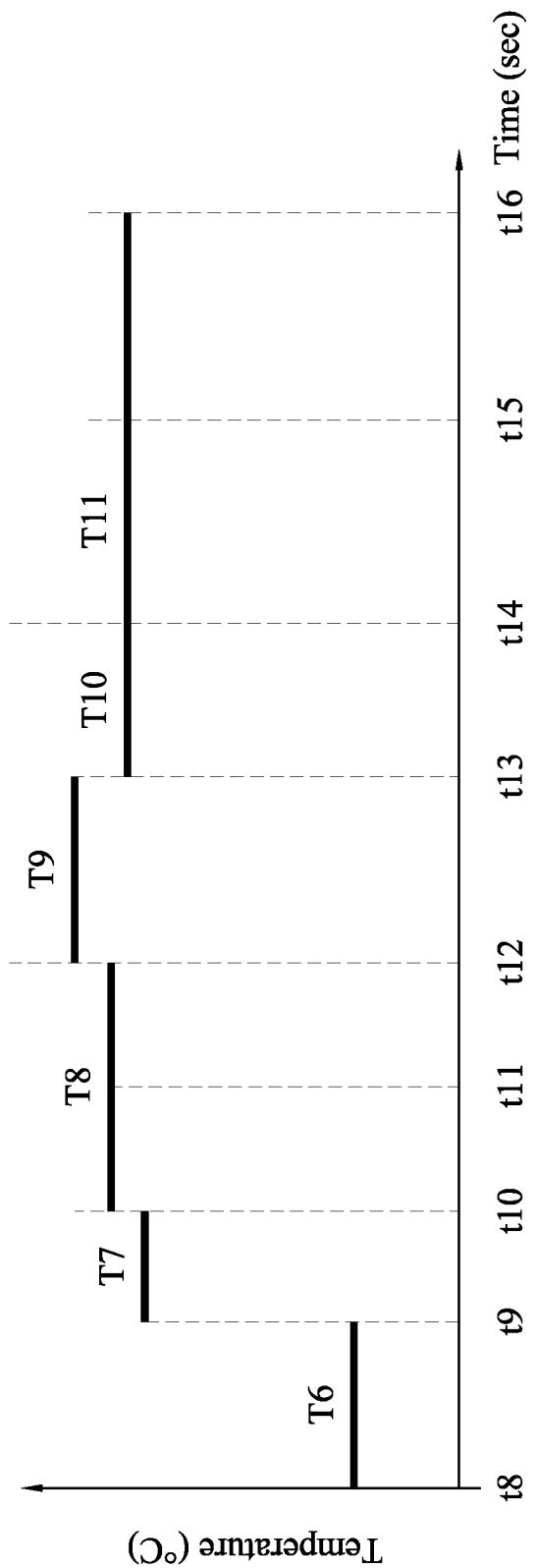

At operation 18, the method 10 (FIG. 2A) etches the fin 103 (particularly the upper portion 103b) in the PMOS region, to form S/D trenches 150p. This may involve multiple processes including photolithography and etching processes. For example, the operation 18 removes the etch mask 290 from the PMOS regions using, for example, resist stripping, ashing, or other suitable methods. Then, the operation 18 forms an etch mask 292 that covers the area for the NMOS and exposes the area for the PMOS, such as shown in FIG. 8. The material and the formation process for the etch mask 292 can be the same as those for the etch mask 290. Then, with the etch mask 292 in place, the operation 18 etches the fin 103 in the PMOS S/D region to recess it (the original un-recessed fin is shown in FIG. 9 with dotted line, which is also the fin under the gate stack 106). The recessed upper portion 103b of the fin 103 in the PMOS S/D region is referred to as 103b". In the present embodiment, the recessed upper portion 103b" in the PMOS regions is taller than the recessed upper portion 103b' in the NMOS regions. The etching process also partially recesses the FSW spacer 107. The recessed FSW spacer 107 in the PMOS region is referred to as 107p. The FSW spacer 107p is recessed to a height H8 (see FIG. 1B-2), which is greater than the height H7. The top surface of the FSW spacer 107p is higher than the bottom surface of the S/D trenches 150p. In the present embodiment, the bottom surface of the S/D trenches 150p is above the top surface of the isolation structure 105, thus the bottom and the sidewall surfaces of the S/D trench 150p are within the upper portion 103b of the semiconductor fin 103. The operation 18 may apply dry etching, wet etching, or a combination thereof. After the etching process finishes, the operation 18 may perform a cleaning process to the S/D trenches 150p in preparation for the subsequent epitaxial growth process. For example, the cleaning process may use inductively coupled plasma with argon, NF$_3$, NH$_3$, or a combination thereof. In an embodiment, the cleaning process is performed at a temperature T6 in a range from room temperature (e.g., 25° C.) to about 250° C. for duration from t8 to t9 that is about 80 seconds to about 400 seconds, as shown in FIG. 23.

At operation 20, the method 10 (FIG. 2A) epitaxially grows the S/D feature 104p in the trench 150p. This involves multiple steps to grow the multiple layers (104p-1, 104p-2, 104p-3, and 104p-4) of the S/D feature 104p, which are discussed below with reference to FIGS. 10-13 and FIG. 23. FIG. 23 illustrates the duration and temperature for each step of the processes in the operation 20.

Figure 10:
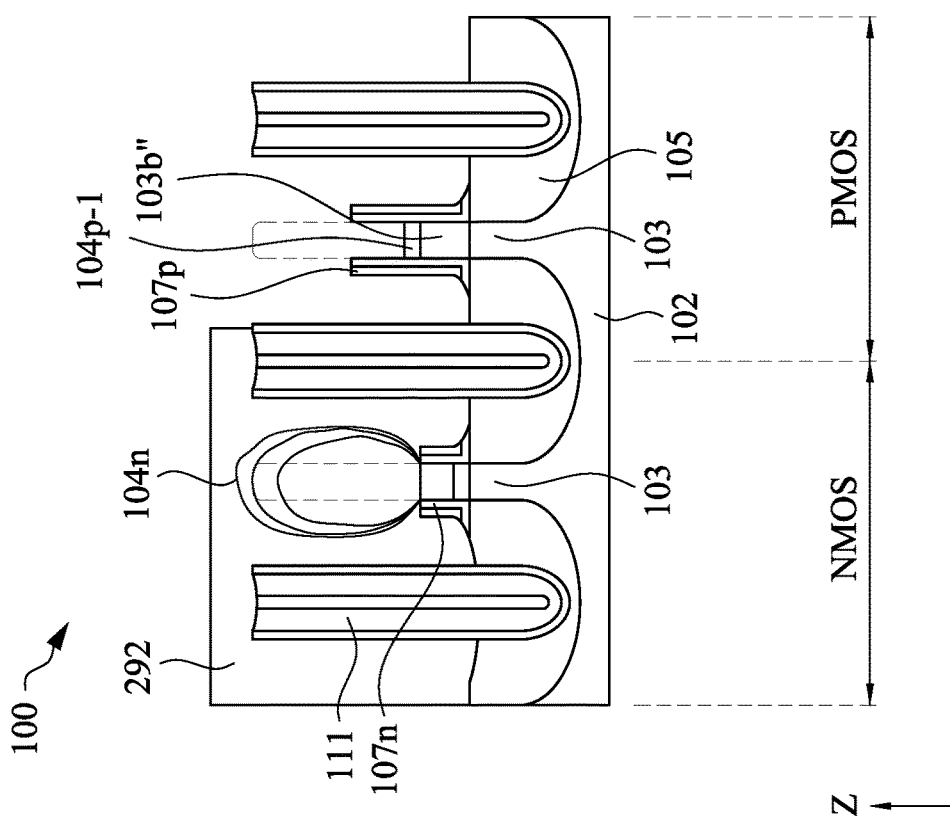

As shown in FIG. 10, the layer 104p-1 is grown on the recessed portion 103b" of the fin 103 in the S/D trenches 150p. In an embodiment, the operation 20 includes depositing a seed layer as the layer 104p-1 with precursors such as DCS, GeH$_4$, HCl, and/or other suitable gases. Further, the deposition is performed at a temperature T7 in a range from about 600° C. to about 650° C., and for duration from t9 to t10 that is about 30 seconds to about 80 seconds, as shown in FIG. 23. With the above deposition, the layer 104p-1 is grown to a thickness about 5 nm to about 20 nm. In an embodiment, the layer 104p-1 includes SiGe:B where the Ge atom % in the SiGe ranges from about 20% to about 40% and B dopant concentration in the SiGe ranges from about $1E10^{20}$ to about $5E10^{20}$ atom/cm$^3$.

Figure 11:
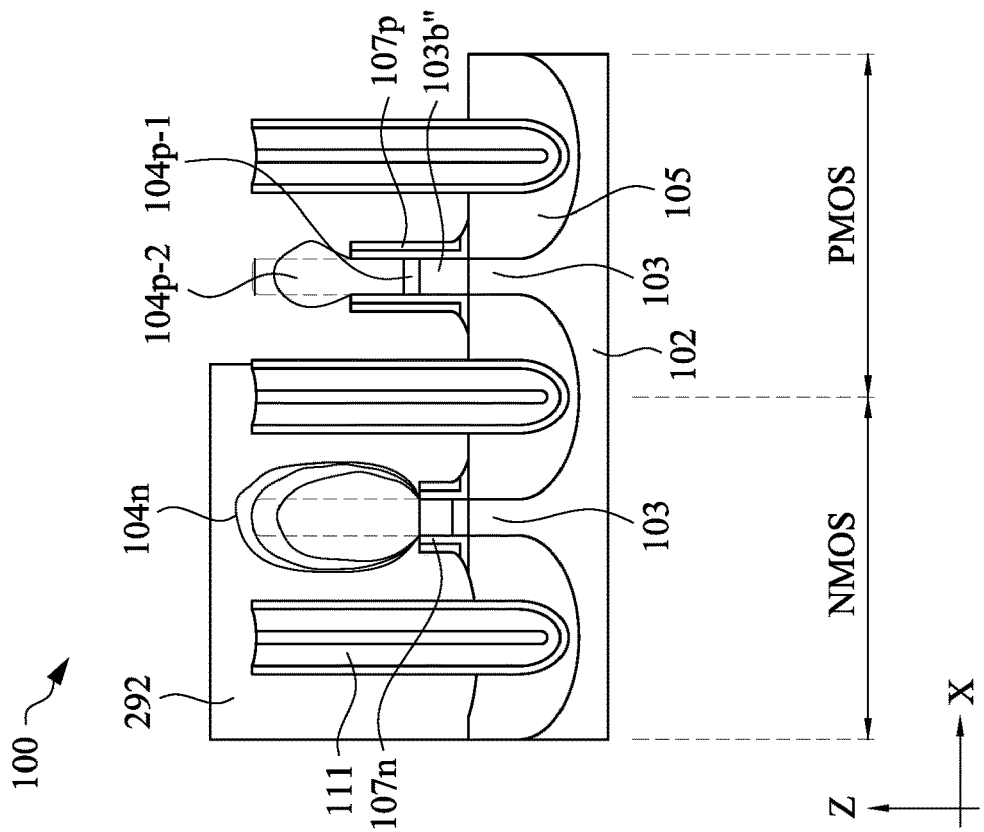

As shown in FIG. 11, the layer 104p-2 is grown on the layer 104p-1. In an embodiment, the operation 20 includes depositing the layer 104p-2 with precursors such as DCS, SiH$_4$, GeH$_4$, HCl, B$_2$H$_6$, and/or other suitable gases. Further, the deposition is performed at a temperature T8 in a range from about 600° C. to about 650° C. and for duration from t10 to t11 that is about 30 seconds to about 80 seconds, as shown in FIG. 23. Then, the operation 20 performs an etching process to the deposited layer, for example, using HCl. Further, the etching is performed at the temperature T8 in a range from about 600° C. to about 650° C. and for duration from t11 to t12 that is about 5 seconds to about 20 seconds, as shown in FIG. 23. With the above deposition and etching, the layer 104p-2 is grown to a thickness about 10 nm to about 30 nm. In an embodiment, the layer 104p-2 includes gradient SiGe doped with B where the Ge atom % in the SiGe gradually increases from about 30% to about 45% as its thickness increases and the B dopant concentration in the SiGe may range from about $1E10^{20}$ to about $1E10^{21}$ atom/cm$^3$.

Figure 12:
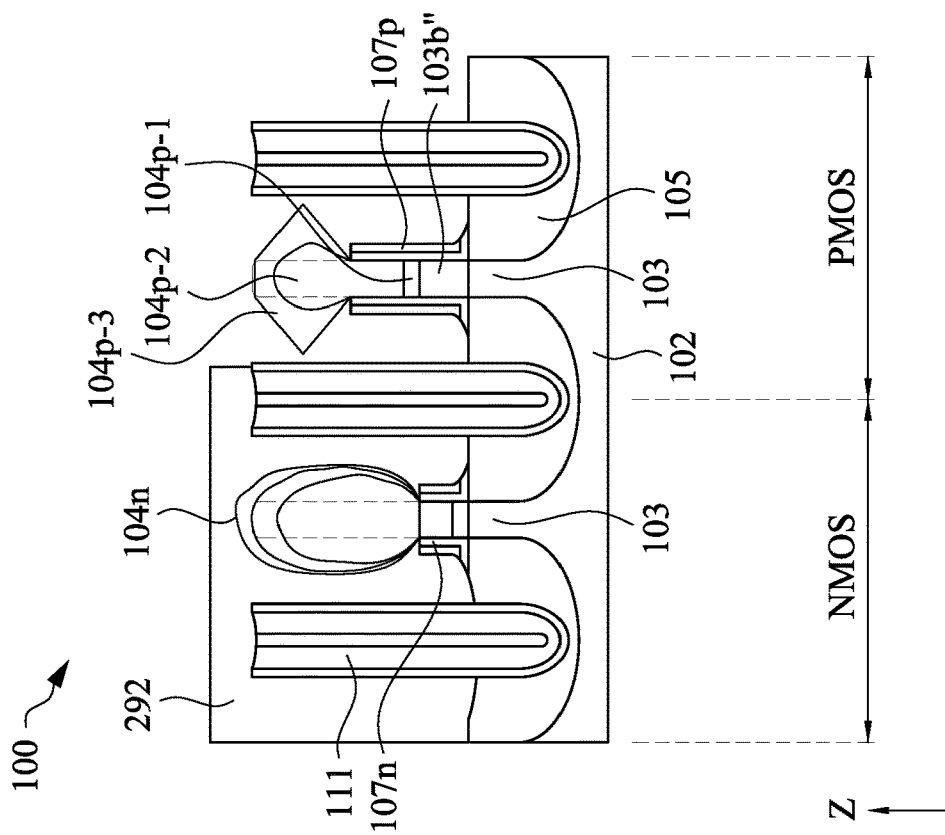

As shown in FIG. 12, the layer 104p-3 is grown on the layer 104p-2. In an embodiment, the operation 20 includes depositing the layer 104p-3 with precursors such as DCS, GeH$_4$, HCl, B$_2$H$_6$, and/or other suitable gases. Further, the deposition is performed at a temperature T9 in a range from about 600° C. to about 650° C. and for duration from t12 to t13 that is about 50 seconds to about 300 seconds, as shown in FIG. 23. Then, the operation 20 performs an etching process to the deposited layer, for example, using HCl. Further, the etching is performed at a temperature T10 in a range from about 600° C. to about 650° C. and for duration from t13 to t14 that is about 10 seconds to about 80 seconds, as shown in FIG. 23. With the above deposition and etching, the layer 104p-3 is grown to a thickness about 5 nm to about 25 nm. In an embodiment, the layer 104p-3 includes a relatively constant SiGe doped with B where the Ge atom % in the SiGe is in a range from about 35% to about 65% and remains substantially constant as the layer's thickness increases, and where the B dopant concentration in the SiGe may range from about $1E10^{21}$ to about $3E10^{21}$ atom/cm$^3$.

Figure 13:
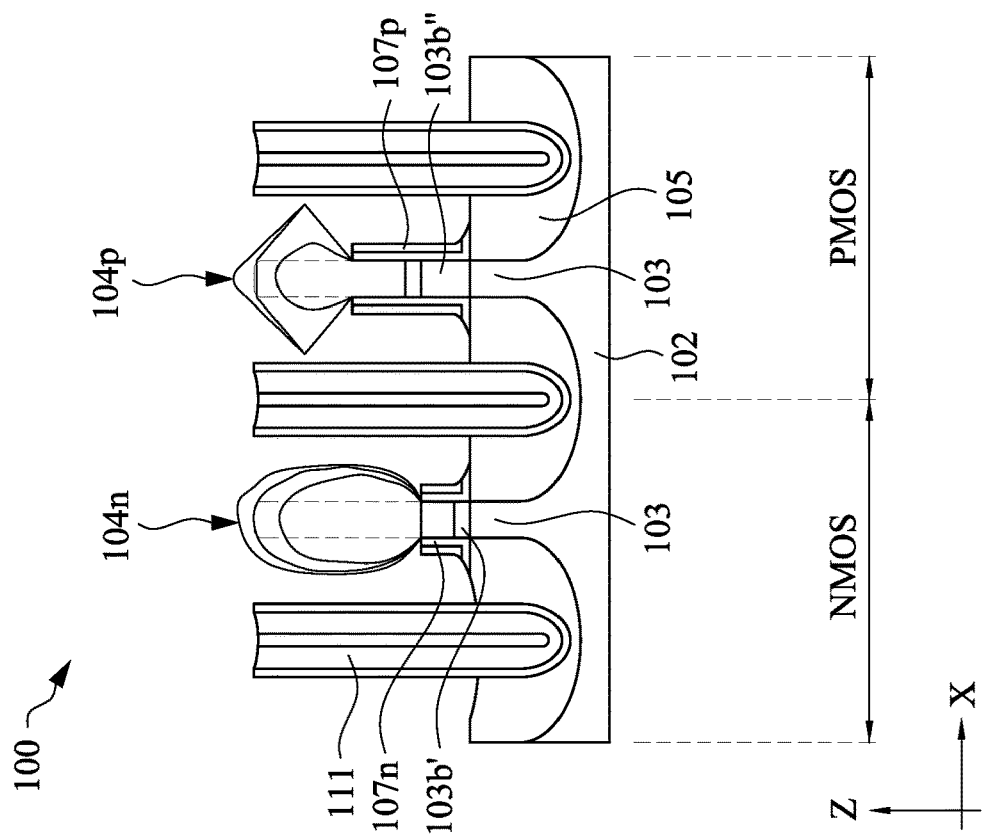
Figure 14:
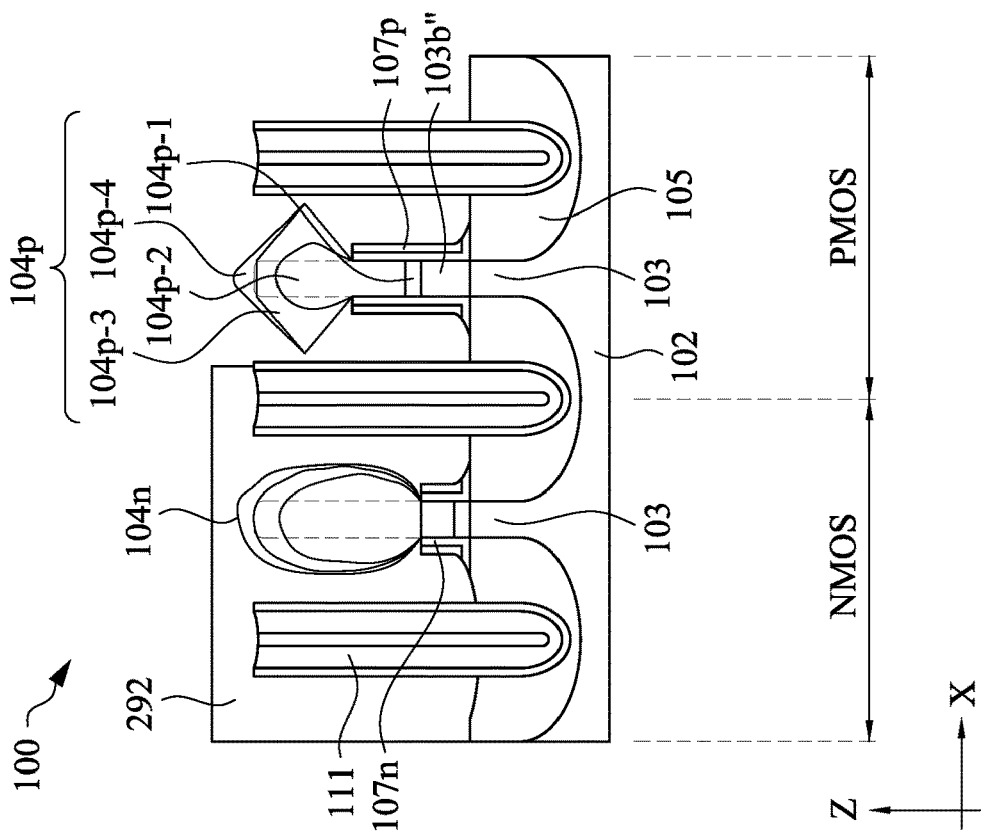

As shown in FIG. 13, the layer 104p-4 is grown on the layer 104p-3. In an embodiment, the operation 20 includes depositing the layer 104p-4 with precursors such as DCS, GeH$_4$, HCl, B$_2$H$_6$, and/or other suitable gases. Further, the deposition is performed at a temperature T11 in a range from about 600° C. to about 650° C. and for duration from t14 to t15 that is about 20 seconds to about 100 seconds, as shown in FIG. 23. Then, the operation 20 performs an etching process to the deposited layer, for example, using HCl, GeH$_4$, and/or other suitable etchants. Further, the etching is performed at the temperature T11 in a range from about 600° C. to about 650° C. and for duration from t15 to t16 that is about 10 seconds to about 50 seconds, as shown in FIG. 23. In an embodiment, the above deposition and etching are repeated few times in a cyclic manner to form the layer 104p-4. With the above deposition and etching, the layer 104p-4 is grown to a thickness about 2 nm to about 10 nm. In an embodiment, the layer 104p-4 includes SiGe doped with B where the Ge atom % in SiGe gradually decreases from about 65% to 40% as its thickness increases and the B dopant concentration in the SiGe may range from about $1E10^{21}$ to about $2E10^{21}$ atom/cm$^3$. The operation 20 may use H₂ gas as the carrier gas with a pressure in a range from about 10 torr to about 50 torr for the precursors and etchants when forming the layers 104p-1, 104p-2, 104p-3, and 104p-4 during the various deposition and etching processes discussed above. Further, in an embodiment, the various temperatures have the following relations: T9>T8>T7, T9>T10 and T11, and T6 is lower than T7 through T11. After the layer 104p-4 has been formed, the operation 20 removes the etch mask 292, for example, resist stripping, ashing, or other suitable methods. The resultant structure of the device 100 is shown in FIG. 14.

In the above embodiment, the method 10 forms the S/D feature 104n before forming the S/D feature 104p. In an alternative embodiment, the method 10 may form the S/D feature 104p before forming the S/D feature 104n. In other words, the operations 18 and 20 may be performed before the operations 14 and 16 are performed.

Figure 15:
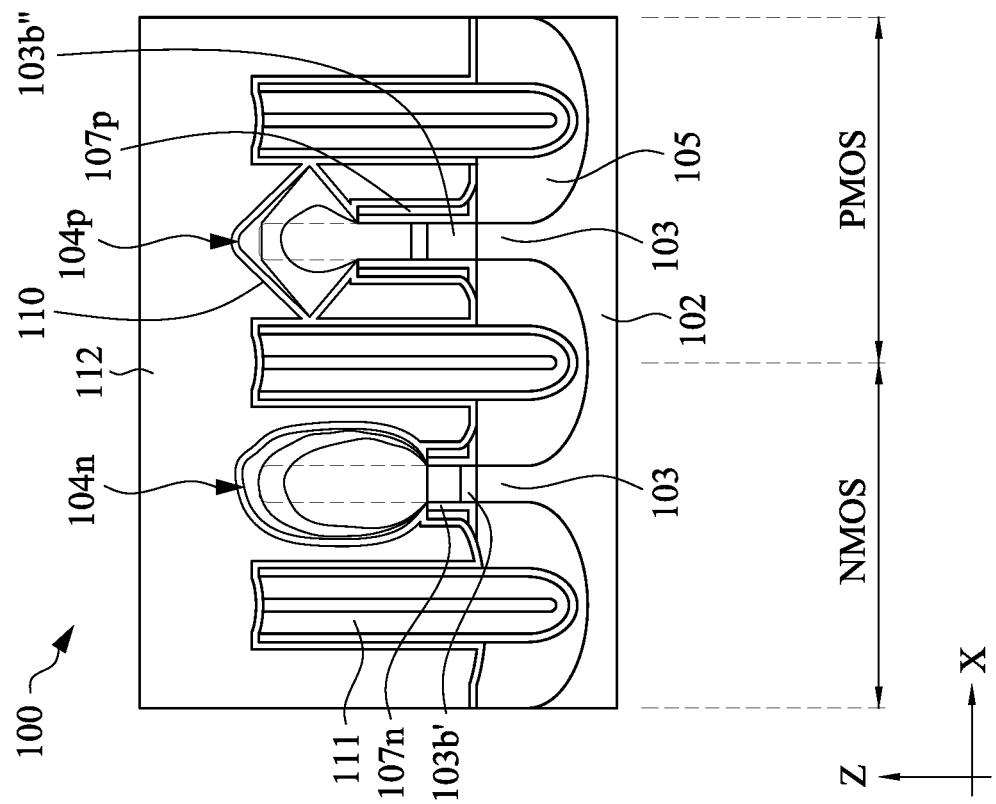

At operation 22, the method 10 (FIG. 2A) forms the CESL 110 and the ILD layer 112, such as shown in FIG. 15. For example, the CESL 110 may be deposited over various surfaces of the S/D features 104n and 104p, the FSW spacers 107, the gate spacers 108, and the sacrificial gate stack 106. Then, the ILD layer 112 is deposited over the CESL 110 and filling the space between the various structures. The operation 22 may perform a CMP process to planarize the top surface of the ILD layer 112 and to expose the sacrificial gate stacks 106 for gate replacement processes. The CESL 110 may include silicon nitride (Si₃N₄), silicon oxynitride (SiON), silicon nitride with oxygen (O) or carbon (C) elements, and/or other materials. The CESL 110 may be formed by plasma enhanced CVD (PECVD) process and/or other suitable deposition or oxidation processes. The ILD 112 may include materials such as TEOS formed oxide, un-doped silicate glass, or doped silicon oxide such as borophosphosilicate glass (BPSG), fluoride-doped silicate glass (FSG), phosphosilicate glass (PSG), boron doped silicon glass (BSG), and/or other suitable dielectric materials. The ILD layer 112 may be deposited by a PECVD process, a flowable CVD (FCVD) process, or other suitable deposition technique.

At operation 24, the method 10 (FIG. 2A) replaces the sacrificial gate stacks 106 with functional gate stacks 106. For example, the operation 24 may perform one or more etching processes to remove the sacrificial gate stacks 106, resulting in gate trenches, and deposit functional gate stacks 106 into the gate trenches.

Figure 16:
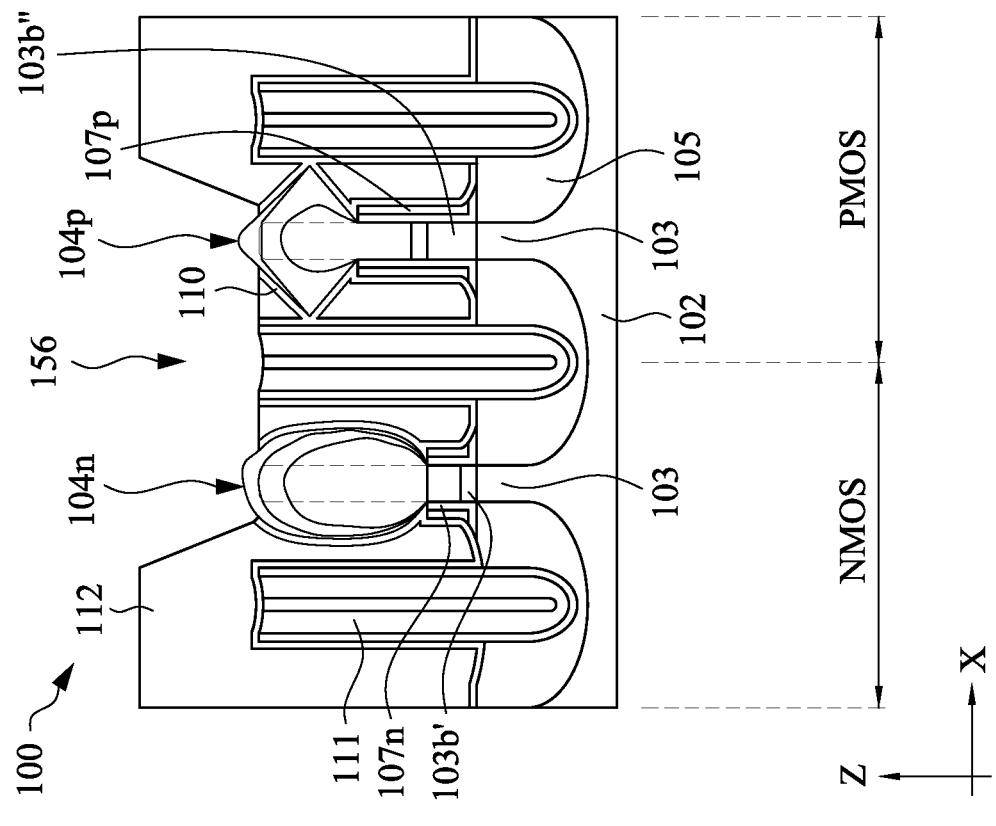

At operation 26, the method 10 (FIG. 2B) etches S/D contact trenches 156 through the ILD layer 112 and the CESL 110 to expose the S/D features 104n and/or 104p, such as shown in FIG. 16 in an embodiment. In an embodiment, an etch mask is formed over the device 100, providing openings exposing various portions of the device 100. The openings correspond to the areas of the device 100 where S/D contacts for S/D features 104n and 104p are to be formed. Subsequently, the device 100 is etched through the openings to remove the exposed portions of the ILD layer 112 and the CESL 110, for example, using a dry etching process, a wet etching process, a reactive ion etching process, other suitable etching processes, or a combination thereof. In an embodiment, the layers 104n-4 and 104p-4 may be etched by the etching process. In an embodiment, the depth of the trenches 156 is in a range of about 20 nm to about 40 nm to provide a sufficiently large trench for S/D contact formation.

Figure 17:
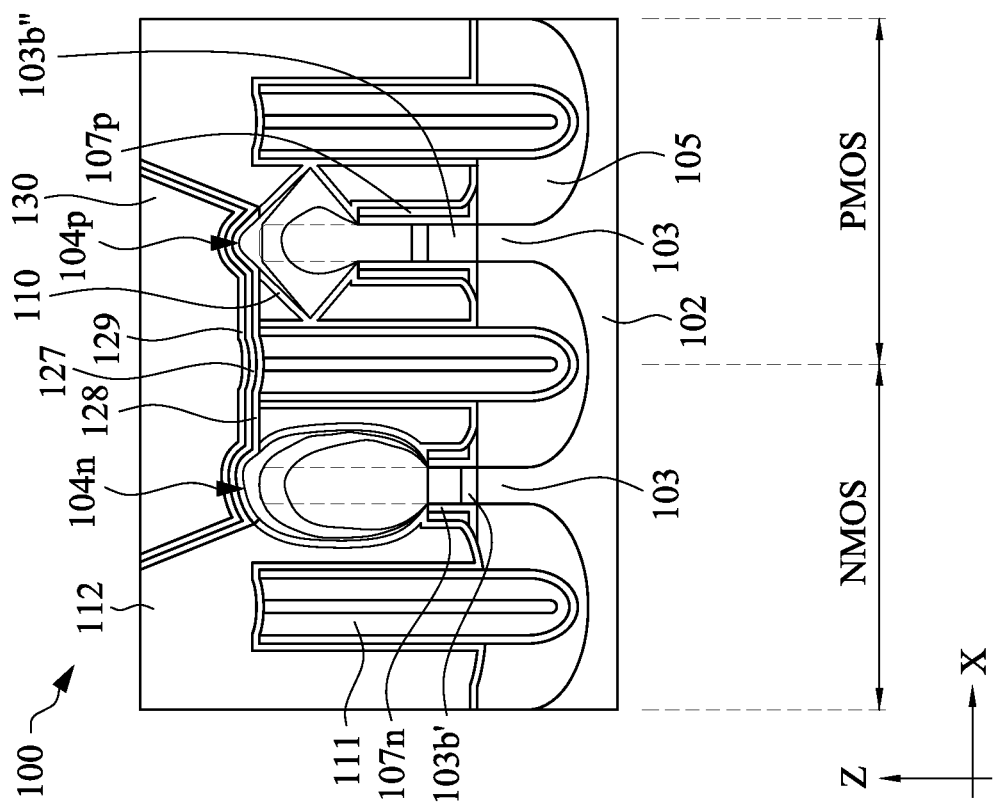

At operation 28, the method 10 (FIG. 2B) forms metal compound feature 128 over the S/D feature 104n and 104p, such as shown in FIG. 17. In an embodiment, the operation 28 includes depositing one or more metals into the contact trench 156, annealing the device 100 so that the one or more metals react with the semiconductor materials in the S/D features 104n and 104p to form the metal compound feature 128, and removing the unreacted metal(s). In the present embodiment, because the top surface of the PEPI 104p is slightly higher than the top surface of the NEPI 104n, the portion of the metal compound feature 128 on the PEPI 104p is slightly higher than the portion of the metal compound feature 128 on the NEPI 104n. In an embodiment, the one or more metals also react with materials (such as Si) in the ILD 112 and/or the dielectric fin 111, thus forming the metal compound feature 128 also on the ILD 112 and/or the dielectric fin 111. For example, when depositing titanium into the contact trench 156, titanium nitride (TiN) may form on the ILD 112 and titanium silicon nitride (TiSiN) may form on the dielectric fin 111. It is noted that the metal compound feature 128 may include different materials in different portions. For example, it may include a silicide (such as TiSi or other metal-semiconductor compounds) over the S/D features 104n and 104p and include a different compound (such as TiN or TiSiN) over the ILD 112 and the dielectric fin 111. The one or more metals may include titanium (Ti), tantalum (Ta), nickel (Ni), platinum (Pt), ytterbium (Yb), iridium (Ir), erbium (Er), cobalt (Co), or a combination thereof (e.g., an alloy of two or more metals), and may be deposited using CVD, PVD, ALD, or other suitable methods. The metal compound feature 128 may include titanium silicide (TiSi), nickel silicide (NiSi), tungsten silicide (WSi), nickel-platinum silicide (NiPtSi), nickel-platinum-germanium silicide (NiPtGeSi), ytterbium silicide (YbSi), platinum silicide (PtSi), iridium silicide (IrSi), erbium silicide (ErSi), cobalt silicide (CoSi), titanium germanosilicide (TiSiGe), nickel germanosilicide (NiSiGe), nickel-platinum germanosilicide (NiPtSiGe), ytterbium germanosilicide (YbSiGe), platinum germanosilicide (PtSiGe), iridium germanosilicide (IrSiGe), erbium germanosilicide (ErSiGe), cobalt germanosilicide (CoSiGe), or other suitable compounds.

Figure 18:
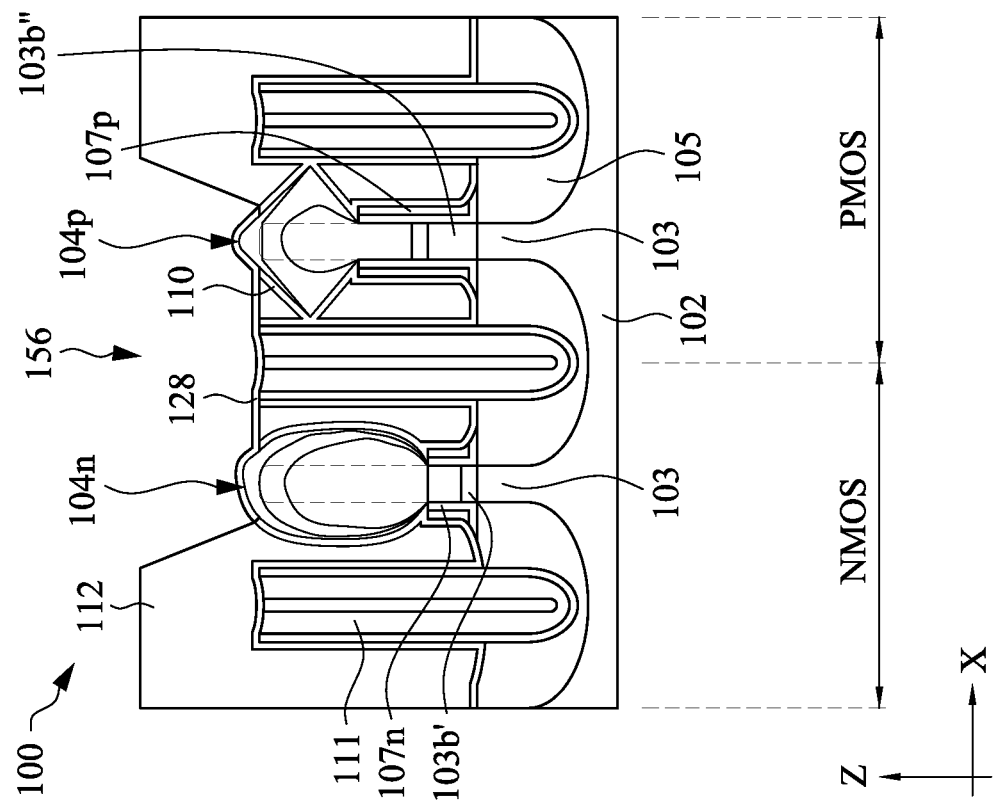

At operation 30, the method 10 (FIG. 2B) forms barrier layers 127, 129 and S/D contact 130 over the metal compound feature 128 and in the contact trench 156, such as shown in FIG. 18. For example, the operation 30 may deposit the barrier layers 127, 129 and the S/D contact 130 using ALD, CVD, PVD, plating, and/or other suitable processes. A CMP process may be performed to planarize a top surface of the device 100 and remove excessive portions of the metallic material(s). In an embodiment, the barrier layer 127 includes silicon titanium nitride (TiSiN) and the barrier layer 129 includes titanium nitride (TiN). Alternatively, each of the barrier layers 127 and 129 may include titanium (Ti), tantalum (Ta), tungsten (W), cobalt (Co), ruthenium (Ru), or a conductive nitride such as titanium nitride (TiN), titanium silicate nitride (TiSiN), titanium aluminum nitride (TiAlN), tungsten nitride (WN), tantalum nitride (TaN), or combinations thereof. In embodiments, the S/D contact 130 may include tungsten (W), cobalt (Co), copper (Cu), other metals, metal nitrides, or combinations thereof.

Figure 19:
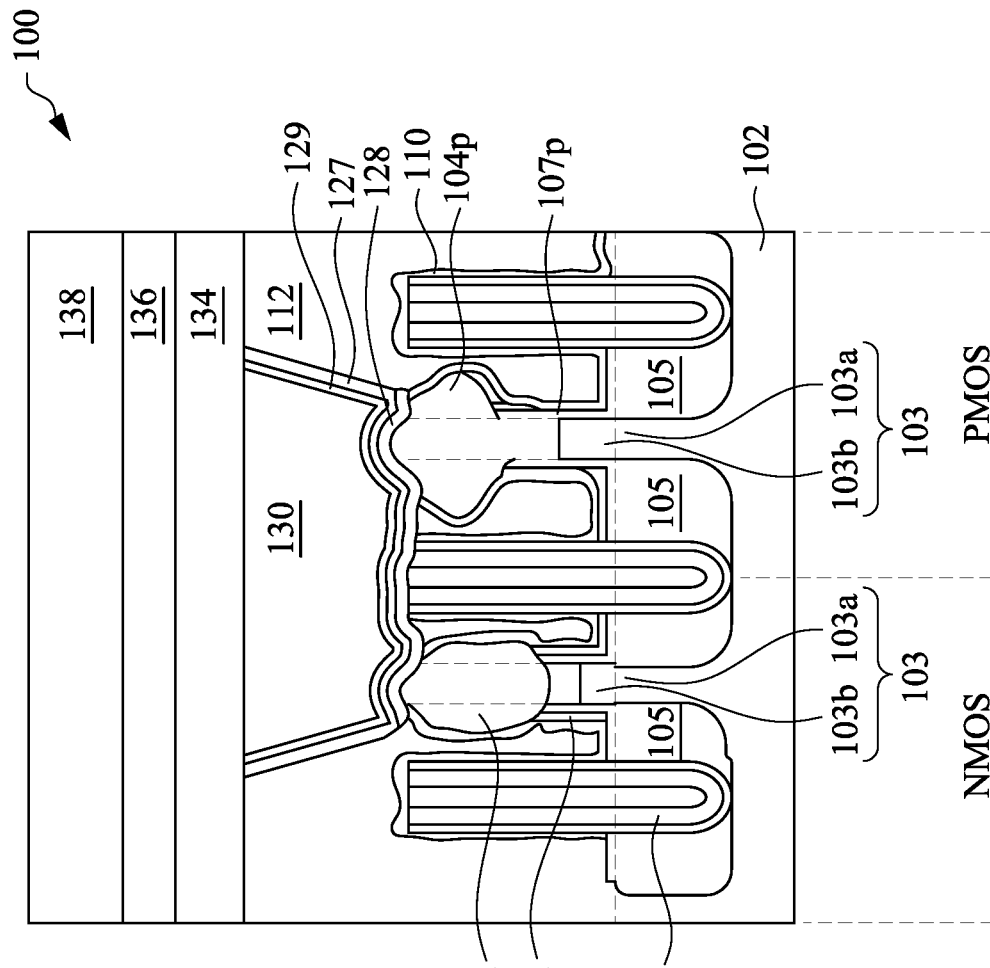

At operation 32, the method 10 (FIG. 2B) deposits dielectric layers 134, 136, and 138 over the ILD layer 112 and the S/D contact 130, such as shown in FIG. 19. The dielectric layers 134, 136, and 138 may be deposited using PECVD process, flowable CVD (FCVD) process, or other suitable deposition techniques. In an embodiment, the dielectric layers 134 and 138 may include TEOS formed oxide, un-doped silicate glass, or doped silicon oxide such as BPSG, FSG, PSG, BSG, and/or other suitable dielectric materials. The dielectric layer 136 includes a different material than those in the layers 134 and 138. For example, the layers 134 and 138 may include silicon oxide and the layer 136 may include silicon nitride ($Si_3N_4$), silicon oxynitride (SiON), silicon nitride with oxygen (O) or carbon (C) elements, and/or other materials.

Figure 20:
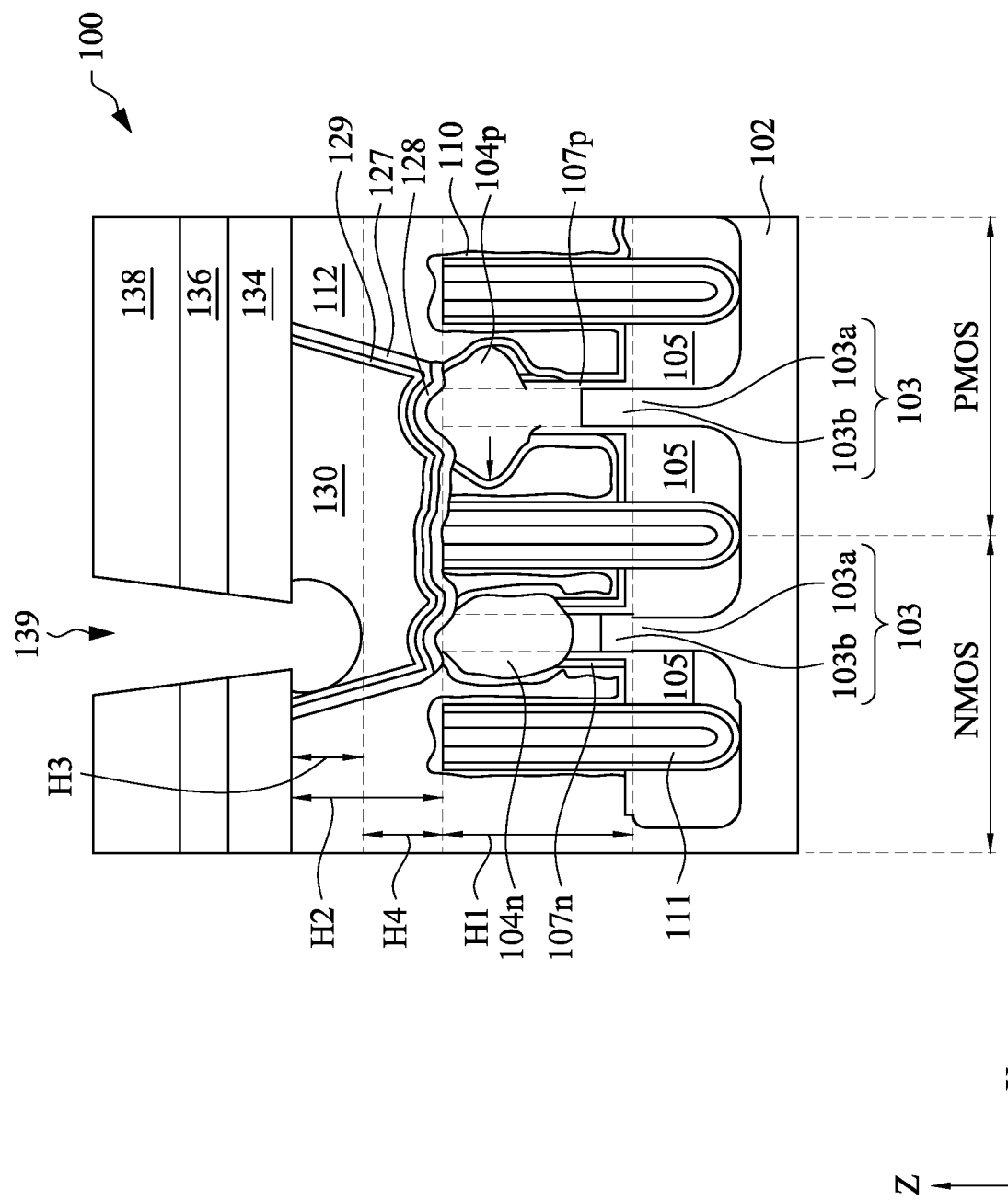

At operation 34, the method 10 (FIG. 2B) etches a via hole 139 that extends through the dielectric layers 138, 136, 134 and partially extends into the S/D contact 130, such as shown in FIG. 20. In an embodiment, the via hole 139 partially extends into the S/D contact 130 by a depth H3 that is in a range from about 5 nm to about 15 nm, which leaves a clearance H4 between the bottom of the via hole 139 and the top surface of the NEPI 104n and/or the metal compound feature 128. The clearance H4 is at least 5 nm for reasons discussed earlier. Further, the bottom portion of the via hole 139 has a rounded profile inside the S/D contact 130 to increase the surface area of the via hole 139. For example, the operation 34 may perform an anisotropic etching (such as anisotropic dry etching) to open the dielectric layers 138, 136, and 134, and then perform an isotropic etching (such as isotropic wet etching) to etch the S/D contact 130 to form the via hole 139 with the depicted profile. The operation 34 may further perform $O_2$ ash and pre-cleaning to the via hole 139, making the surfaces of the via hole 139 ready for the metal deposition in operation 36.

Figure 21:
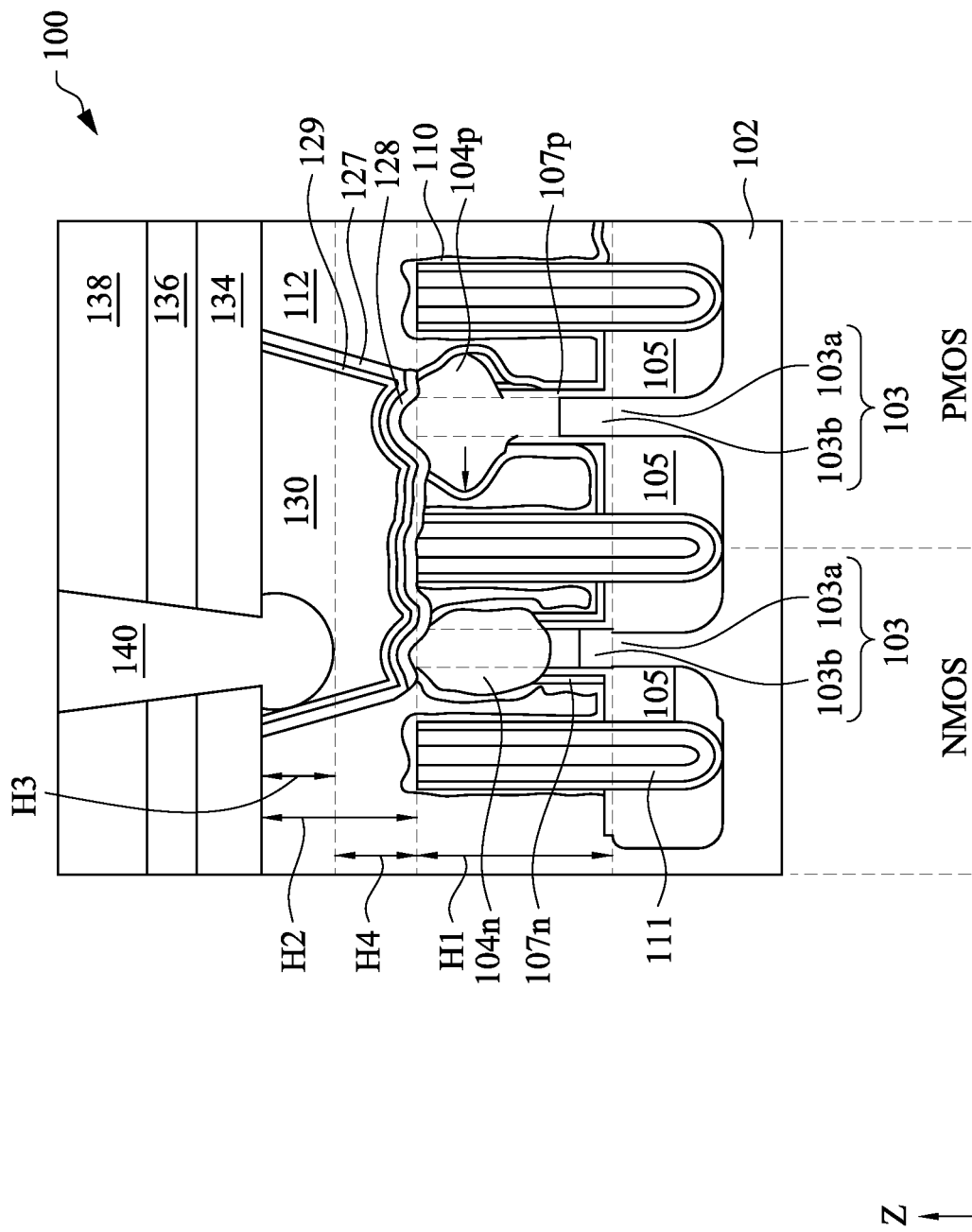

At operation 36, the method 10 (FIG. 2B) forms the via plug 140 in the via hole 139, such as shown in FIG. 21. In an embodiment, the via plug 140 is formed to be barrier-less. In other words, there is no barrier layer between the via plug 140 and the S/D contact 130 (i.e., the via plug 140 directly contacts the S/D contact 130), which advantageously reduces electrical resistance between the via plug 140 and the S/D contact 130. Further, there is no barrier layer between the via plug 140 and the dielectric layers 138, 136, 134. The operation 36 may deposit one or more metal or metal compounds into the via hole 139 and perform a CMP process to the one or more metal or metal compounds. The remaining portion of the one or more metal or metal compounds becomes the via plug 140. In an embodiment, the operation 36 deposit the one or more metal or metal compounds using a selective metal deposition technique. In a further embodiment, the operation 36 performs an ion implantation (such as with Ge ions) to the sidewalls of the dielectric layer 138, 136, 134 that surround the via plug 140. The implanted sidewalls serve to seal the metal elements of the via plug 140 and block them from diffusing into the dielectric layer 138, 136, 134. In embodiments, the via plug 140 may include tungsten (W), tungsten carbide (WC), cobalt (Co), other metals, metal nitrides, or combinations thereof; and may be deposited using ALD, CVD, PVD, plating, and/or other suitable processes.

At operation 38, the method 10 (FIG. 2B) performs further steps to complete the fabrication of the device 100. For example, it may perform various processes to form metal interconnects connecting the transistors as well as other portions of the device 100 to form a complete IC.

Although not intended to be limiting, one or more embodiments of the present disclosure provide many benefits to a semiconductor device and a formation process thereof. For example, embodiments of the present disclosure form NEPI and PEPI structures so that NEPI structures are larger, but slightly lower, than the PEPI. The NEPI and PEPI structures allow S/D contacts and S/D contact via plugs to be formed without damaging metal compound features on the NEPI and PEPI, particularly when the S/D contact via plugs are partially embedded in the S/D contacts. Both NEPI and PEPI have large platens for enlarged contact landing areas. Further, the provided subject matter can be readily integrated into existing IC fabrication flow and can be applied to many different process nodes.

In one example aspect, the present disclosure is directed to a semiconductor structure that includes an n-type epitaxial source/drain feature (NEPI) and a p-type epitaxial source/drain feature (PEPI) over a substrate, wherein a top surface of the NEPI is lower than a top surface of the PEPI. The semiconductor structure further includes a metal compound feature disposed on the top surface of the NEPI and the top surface of the PEPI; a contact feature disposed on the metal compound feature and over both the NEPI and the PEPI; and a via structure disposed over the contact feature and over the NEPI, wherein the via structure is partially in the contact feature.

In an embodiment of the semiconductor structure, a shortest distance between the via structure and the metal compound feature is at least 5 nm. In another embodiment, a total volume of the NEPI is greater than a total volume of the PEPI.

In an embodiment, the semiconductor structure further includes a dielectric fin over the substrate and between the NEPI and the PEPI, wherein a shortest horizontal distance between the NEPI and the dielectric fin is larger than a shortest horizontal distance between the PEPI and the dielectric fin. In another embodiment, the semiconductor structure further includes one or more dielectric layers surrounding the NEPI, the PEPI, the metal compound feature, the contact feature, and the via structure; and a barrier layer disposed between the contact feature and the one or more dielectric layers, wherein the via structure is in direct contact with the contact feature and the one or more dielectric layers. In an embodiment, the via structure extends into the contact feature by about 5 nm to about 15 nm.

In an embodiment, the semiconductor structure further includes a first fin structure and a second fin structure over the substrate, wherein the NEPI is grown over a recessed portion of the first fin structure, and the PEPI is grown over a recessed portion of the second fin structure; a first sidewall spacer disposed along sidewalls of the recessed portion of the first fin structure; and a second sidewall spacer disposed along sidewalls of the recessed portion of the second fin structure, wherein the second sidewall spacer is taller than the first sidewall spacer. In a further embodiment, the second sidewall spacer is four to eight times taller than the first sidewall spacer. In another further embodiment, the top surface of the NEPI is higher than a topmost surface of the first fin structure by a first raised height, the top surface of the PEPI is higher than a topmost surface of the second fin structure by a second raised height, wherein the second raised height is greater than the first raised height. In a further embodiment, the second raised height is greater than the first raised height by at least 2 nm. In another further embodiment, a first width of the NEPI measured at 1 nm below a topmost surface of the first fin structure is greater than a second width of the PEPI measured at 1 nm below a topmost surface of the second fin structure.

In another example aspect, the present disclosure is directed to a semiconductor structure that includes a first fin structure and a second fin structure over a substrate, an n-type epitaxial source/drain feature (NEPI) grown on a recessed portion of the first fin structure, wherein a height of the NEPI is at least 1.5 times greater than a critical dimension (CD) of the NEPI measured at a widest part of the NEPI, and a p-type epitaxial source/drain feature (PEPI) grown on a recessed portion of the second fin structure, wherein a topmost surface of the PEPI is higher than a topmost surface of the NEPI. The semiconductor structure further includes a dielectric fin over the substrate and between the NEPI and the PEPI, wherein a shortest horizontal distance between the NEPI and the dielectric fin is larger than a shortest horizontal distance between the PEPI and the dielectric fin. The semiconductor structure further includes a metal compound feature disposed over the NEPI, the PEPI, and the dielectric fin; a contact feature disposed on the metal compound feature; and a via structure disposed over the contact feature and directly above the NEPI, wherein the via structure extends partially into the contact feature.

In an embodiment, a shortest distance between the via structure and the metal compound feature is at least 5 nm. In another embodiment, a first width of the NEPI measured at 1 nm below a topmost surface of the first fin structure is greater than a second width of the PEPI measured at 1 nm below a topmost surface of the second fin structure.

In an embodiment, the topmost surface of the NEPI is higher than a topmost surface of the first fin structure by a first raised height, the topmost surface of the PEPI is higher than a topmost surface of the second fin structure by a second raised height, wherein the second raised height is greater than the first raised height by at least 2 nm.

In an embodiment, the semiconductor structure further includes a first sidewall spacer disposed along sidewalls of the recessed portion of the first fin structure; and a second sidewall spacer disposed along sidewalls of the recessed portion of the second fin structure, wherein the second sidewall spacer is taller than the first sidewall spacer.

In yet another example aspect, the present disclosure is directed to a method that includes providing a structure having a substrate, an isolation structure over the substrate, first and second semiconductor fins extending from the substrate and protruding above the isolation structure, a dielectric fin extending from the isolation structure and between the first and the second semiconductor fins, and first and second dielectric spacers on sidewalls of the first and the second semiconductor fins, respectively. The method further includes forming a first etch mask covering the second semiconductor fin and the second dielectric spacer and exposing the first semiconductor fin and the first dielectric spacer and etching the first semiconductor fin and the first dielectric spacer through the first etch mask, resulting in a recessed portion of the first semiconductor fin, wherein a remaining portion of the first dielectric spacer has a first height. The method further includes epitaxially growing an n-type source/drain feature on the recessed portion of the first semiconductor fin, wherein a topmost surface of the n-type source/drain feature is higher than a topmost surface of the first semiconductor fin by a first raised height. The method further includes removing the first etch mask; forming a second etch mask covering the n-type source/drain feature, the first semiconductor fin, and the remaining portion of the first dielectric spacer and exposing the second semiconductor fin and the second dielectric spacer; and etching the second semiconductor fin and the second dielectric spacer through the second etch mask, resulting in a recessed portion of the second semiconductor fin, wherein a remaining portion of the second dielectric spacer has a second height greater than the first height. The method further includes epitaxially growing a p-type source/drain feature on the recessed portion of the second semiconductor fin, wherein a topmost surface of the p-type source/drain feature is higher than a topmost surface of the second semiconductor fin by a second raised height greater than the first raised height.

In an embodiment, the method further includes forming one or more dielectric layers over the n-type source/drain feature, the p-type source/drain feature, and the dielectric fin; etching a contact hole in the one or more dielectric layers, thereby exposing topmost surface of the n-type source/drain feature and the topmost surface of the p-type source/drain feature; forming a metal compound feature on the topmost surface of the n-type source/drain feature and the topmost surface of the p-type source/drain feature; forming a contact feature over the metal compound feature and in the contact hole; and forming a via structure over the contact feature and partially extending into the contact feature. In a further embodiment, the forming of the via structure includes etching a hole into the contact feature, wherein a bottom surface of the hole is vertically distanced from the metal compound feature by at least 5 nm, and depositing a via metal into the hole. In an embodiment, the metal compound feature is also formed directly above the dielectric fin.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    an n-type epitaxial source/drain feature (NEPI) and a p-type epitaxial source/drain feature (PEPI) over a substrate, wherein a top surface of the NEPI is lower than a top surface of the PEPI;
    a metal compound feature disposed on the top surface of the NEPI and the top surface of the PEPI;
    a contact feature disposed on the metal compound feature and over both the NEPI and the PEPI; and
    a via structure disposed over the contact feature and over the NEPI, wherein the via structure is partially in the contact feature.

2. The semiconductor structure of claim 1, wherein a shortest distance between the via structure and the metal compound feature is at least 5 nm.

3. The semiconductor structure of claim 1, wherein a total volume of the NEPI is greater than a total volume of the PEPI.

4. The semiconductor structure of claim 1, further comprising:
    a dielectric fin over the substrate and between the NEPI and the PEPI, wherein a shortest horizontal distance between the NEPI and the dielectric fin is larger than a shortest horizontal distance between the PEPI and the dielectric fin.

5. The semiconductor structure of claim 1, further comprising:
    one or more dielectric layers surrounding the NEPI, the PEPI, the metal compound feature, the contact feature, and the via structure; and a barrier layer disposed between the contact feature and the one or more dielectric layers, wherein the via structure is in direct contact with the contact feature and the one or more dielectric layers.

6. The semiconductor structure of claim 1, wherein the via structure extends into the contact feature by about 5 nm to about 15 nm.

7. The semiconductor structure of claim 1, further comprising:
a first fin structure and a second fin structure over the substrate, wherein the NEPI is grown over a recessed portion of the first fin structure, and the PEPI is grown over a recessed portion of the second fin structure;
a first sidewall spacer disposed along sidewalls of the recessed portion of the first fin structure; and
a second sidewall spacer disposed along sidewalls of the recessed portion of the second fin structure, wherein the second sidewall spacer is taller than the first sidewall spacer.

8. The semiconductor structure of claim 7, wherein the second sidewall spacer is four to eight times taller than the first sidewall spacer.

9. The semiconductor structure of claim 7, wherein the top surface of the NEPI is higher than a topmost surface of the first fin structure by a first raised height, the top surface of the PEPI is higher than a topmost surface of the second fin structure by a second raised height, wherein the second raised height is greater than the first raised height.

10. The semiconductor structure of claim 9, wherein the second raised height is greater than the first raised height by at least 2 nm.

11. The semiconductor structure of claim 7, wherein a first width of the NEPI measured at 1 nm below a topmost surface of the first fin structure is greater than a second width of the PEPI measured at 1 nm below a topmost surface of the second fin structure.

12. A semiconductor structure, comprising:
a first fin structure and a second fin structure over a substrate;
an n-type epitaxial source/drain feature (NEPI) grown on a recessed portion of the first fin structure, wherein a height of the NEPI is at least 1.5 times greater than a critical dimension (CD) of the NEPI measured at a widest part of the NEPI;
a p-type epitaxial source/drain feature (PEPI) grown on a recessed portion of the second fin structure, wherein a topmost surface of the PEPI is higher than a topmost surface of the NEPI;
a dielectric fin over the substrate and between the NEPI and the PEPI, wherein a shortest horizontal distance between the NEPI and the dielectric fin is larger than a shortest horizontal distance between the PEPI and the dielectric fin;
a metal compound feature disposed over the NEPI, the PEPI, and the dielectric fin;
a contact feature disposed on the metal compound feature; and
a via structure disposed over the contact feature and directly above the NEPI, wherein the via structure extends partially into the contact feature.

13. The semiconductor structure of claim 12, wherein a shortest distance between the via structure and the metal compound feature is at least 5 nm.

14. The semiconductor structure of claim 12, wherein a first width of the NEPI measured at 1 nm below a topmost surface of the first fin structure is greater than a second width of the PEPI measured at 1 nm below a topmost surface of the second fin structure.

15. The semiconductor structure of claim 12, wherein the topmost surface of the NEPI is higher than a topmost surface of the first fin structure by a first raised height, the topmost surface of the PEPI is higher than a topmost surface of the second fin structure by a second raised height, wherein the second raised height is greater than the first raised height by at least 2 nm.

16. The semiconductor structure of claim 12, further comprising:
a first sidewall spacer disposed along sidewalls of the recessed portion of the first fin structure; and
a second sidewall spacer disposed along sidewalls of the recessed portion of the second fin structure, wherein the second sidewall spacer is taller than the first sidewall spacer.

17. A method comprising:
providing a structure having a substrate, an isolation structure over the substrate, first and second semiconductor fins extending from the substrate and protruding above the isolation structure, a dielectric fin extending from the isolation structure and between the first and the second semiconductor fins, and first and second dielectric spacers on sidewalls of the first and the second semiconductor fins, respectively;
forming a first etch mask covering the second semiconductor fin and the second dielectric spacer and exposing the first semiconductor fin and the first dielectric spacer;
etching the first semiconductor fin and the first dielectric spacer through the first etch mask, resulting in a recessed portion of the first semiconductor fin, wherein a remaining portion of the first dielectric spacer has a first height;
epitaxially growing an n-type source/drain feature on the recessed portion of the first semiconductor fin, wherein a topmost surface of the n-type source/drain feature is higher than a topmost surface of the first semiconductor fin by a first raised height;
removing the first etch mask;
forming a second etch mask covering the n-type source/drain feature, the first semiconductor fin, and the remaining portion of the first dielectric spacer and exposing the second semiconductor fin and the second dielectric spacer;
etching the second semiconductor fin and the second dielectric spacer through the second etch mask, resulting in a recessed portion of the second semiconductor fin, wherein a remaining portion of the second dielectric spacer has a second height greater than the first height; and
epitaxially growing a p-type source/drain feature on the recessed portion of the second semiconductor fin, wherein a topmost surface of the p-type source/drain feature is higher than a topmost surface of the second semiconductor fin by a second raised height greater than the first raised height.

18. The method of claim 17, further comprising:
forming one or more dielectric layers over the n-type source/drain feature, the p-type source/drain feature, and the dielectric fin;
etching a contact hole in the one or more dielectric layers, thereby exposing the topmost surface of the n-type source/drain feature and the topmost surface of the p-type source/drain feature;

forming a metal compound feature on the topmost surface of the n-type source/drain feature and the topmost surface of the p-type source/drain feature;

forming a contact feature over the metal compound feature and in the contact hole; and forming a via structure over the contact feature and partially extending into the contact feature.

19. The method of claim 18, wherein the forming of the via structure includes:

etching a hole into the contact feature, wherein a bottom surface of the hole is vertically distanced from the metal compound feature by at least 5 nm; and depositing a via metal into the hole.

20. The method of claim 18, wherein the metal compound feature is also formed directly above the dielectric fin.

* * * * *